(12) United States Patent
Choi et al.

(10) Patent No.: US 8,367,535 B2
(45) Date of Patent: Feb. 5, 2013

(54) METHOD OF FABRICATING SEMICONDUCTOR DEVICE

(75) Inventors: Yong-Soon Choi, Yongin-si (KR); Ha-Young Yi, Seongnam-si (KR); Gil-Heyun Choi, Seoul (KR); Eunkee Hong, Seongnam-si (KR); Sang-Hoon Ahn, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 13/053,668

(22) Filed: Mar. 22, 2011

(65) Prior Publication Data
US 2011/0281427 A1 Nov. 17, 2011

(30) Foreign Application Priority Data
May 14, 2010 (KR) .................. 10-2010-0045567

(51) Int. Cl.
*H01L 21/28* (2006.01)
(52) U.S. Cl. ............... 438/587; 438/592; 257/E21.19
(58) Field of Classification Search ............ None
See application file for complete search history.

(56) References Cited

U.S. PATENT DOCUMENTS
2006/0089008 A1* 4/2006 Hong et al. ............... 438/778

FOREIGN PATENT DOCUMENTS
| KR | 2000-0074605 A | 12/2000 |
| KR | 20020043121 A | 6/2002 |
| KR | 10-0370242 B1 | 1/2003 |
| KR | 10-0669105 B1 | 1/2007 |

* cited by examiner

*Primary Examiner* — Seahvosh Nikmanesh
(74) *Attorney, Agent, or Firm* — Harness, Dickey & Pierce, P.L.C.

(57) ABSTRACT

Example embodiments herein relate to a method of fabricating a semiconductor device. The method may include forming a liner insulating layer on a surface of a gate pattern to have a first thickness. Subsequently, a gap fill layer may be formed on the liner insulating layer by flowable chemical vapor deposition (FCVD) or spin-on-glass (SOG). The liner insulating layer and the gap fill layer may be recessed such that the liner insulating layer has a second thickness, which is smaller than the first thickness, in the region in which a metal silicide will be formed. Metal silicide may be formed on the plurality of gate patterns to have a relatively uniform thickness using the difference in thickness of the liner insulating layer.

20 Claims, 16 Drawing Sheets

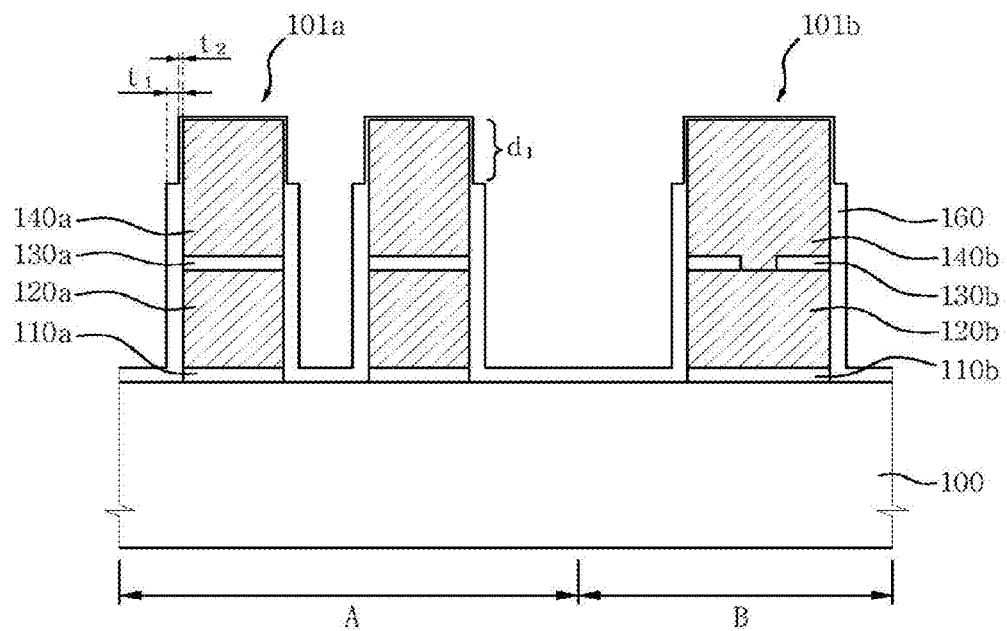
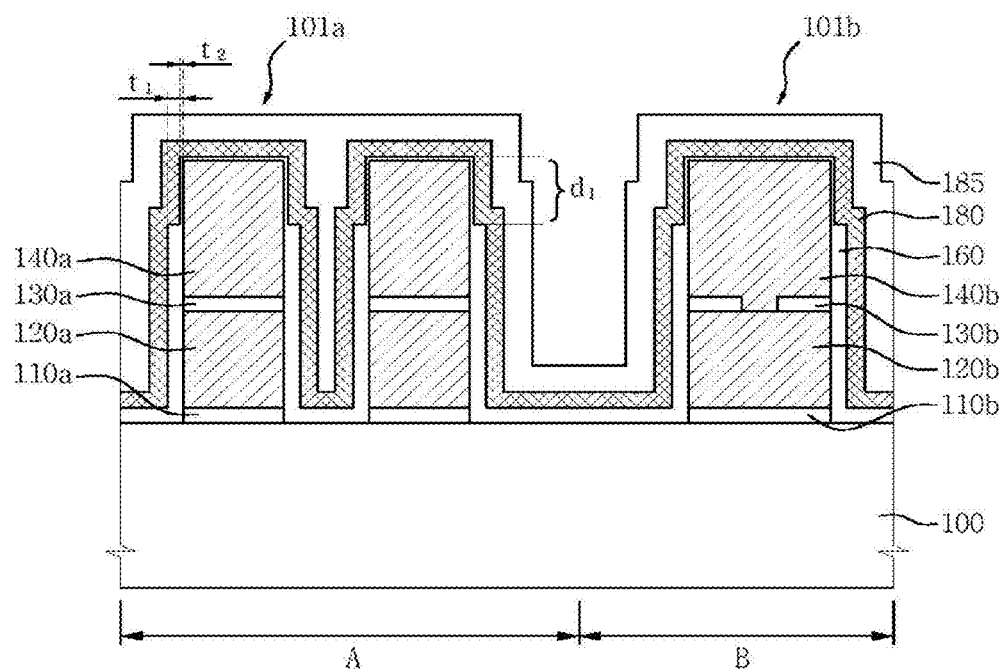

ing on May 14, 2010 with the Korean Intellectual Property Office, the disclosure of which is hereby incorporated by reference in its entirety.

METHOD OF FABRICATING SEMICONDUCTOR DEVICE

CROSS-REFERENCE TO RELATED APPLICATION

This application claims priority under 35 U.S.C. §119 to Korean Patent Application No. 10-2010-0045567, filed on May 14, 2010 with the Korean Intellectual Property Office, the disclosure of which is hereby incorporated by reference in its entirety.

BACKGROUND

1. Field

Example embodiments of the inventive concepts relate to a method of fabricating a semiconductor device.

2. Description of Related Art

Semiconductor devices include volatile memory devices (such as a dynamic random access memory (DRAM) device and a static random access memory (SRAM) device) and non-volatile memory devices. Non-volatile memory devices can retain data even when no power is supplied. Such a non-volatile memory device may include an electrically erasable and programmable ROM (EEPROM) capable of electrically inputting and outputting data and a flash memory device.

SUMMARY

Example embodiments of the inventive concepts relate to a method of fabricating a semiconductor device capable of forming a metal silicide having a relatively uniform thickness in a desired (or, alternatively, predetermined) upper region of a gate pattern.

The inventive concepts are not limited to the following example embodiments. It should be understood that other embodiments that are not expressly described herein would also be readily appreciated by those of ordinary skill in the art.

In accordance with a non-limiting aspect of the inventive concepts, a method of fabricating a semiconductor device may include forming a plurality of gate patterns on a substrate. Subsequently, a liner insulating layer may be formed on surfaces of the plurality of gate patterns so as to have a first thickness. Then, a gap fill layer filling a gap between adjacent gate patterns may be formed on the liner insulating layer by flowable chemical vapor deposition (FCVD) or spin-on-glass (SOG). In addition, the liner insulating layer and the gap fill layer may be recessed such that the liner insulating layer has a second thickness (which is smaller than the first thickness) in desired (or, alternatively, predetermined) upper and side regions of the plurality of gate patterns. A metal layer may also be formed on the liner insulating layer and the gap fill layer. A metal silicide may be formed using the metal layer. In particular, the upper regions of the plurality of gate patterns may be transformed into a metal silicide using the metal layer.

The method may further include forming an interlayer insulating layer on the liner insulating layer and the gap fill layer.

The method may further include removing the metal layer remaining after the metal silicide is formed. A spacer may be formed on a side surface of the metal silicide. The method may further include forming an interlayer insulating layer on the liner insulating layer, the gap fill layer, and the spacer.

Forming the plurality of gate patterns may further include forming a first insulating layer on the substrate. Subsequently, a first silicon layer may be formed on the first insulating layer. Then, a second insulating layer may be formed on the first silicon layer. A second silicon layer may be formed on the second insulating layer. Then, the first insulating layer, the first silicon layer, the second insulating layer, and the second silicon layer may be etched to form the plurality of gate patterns.

The first and second silicon layers may be formed of polycrystalline silicon doped with impurities.

The method may include forming the second insulating layer of an oxide/nitride/oxide (ONO) layer.

The method may include forming the gap fill layer of a carbon-containing oxide layer.

The method may include simultaneously recessing the liner insulating layer and the gap fill layer such that the liner insulating layer has the second thickness in the desired (or, alternatively, predetermined) upper and side regions of the plurality of gate patterns.

In accordance with another non-limiting aspect of the inventive concepts, a method of fabricating a semiconductor device may include forming at least one cell gate pattern and at least one selection gate pattern on a substrate. Subsequently, a liner insulating layer may be formed on surfaces of the cell gate pattern and the selection gate pattern so as to have a first thickness. A gap fill layer filling gaps between adjacent cell gate patterns and between the cell gate pattern and the selection gate pattern may be formed on the liner insulating layer by FCVD or SOG. The liner insulating layer and the gap fill layer may be recessed such that the liner insulating layer has a second thickness (which is smaller than the first thickness) in desired (or, alternatively, predetermined) upper and side regions of the cell gate pattern and the selection gate pattern. Then, the gap fill layer may be partially or completely removed. A metal layer may be formed on the liner insulating layer. A metal silicide may be formed using the metal layer. In particular, the upper regions of the cell gate pattern and selection gate pattern may be transformed into a metal silicide using the metal layer.

The method may further include forming spacers on side surfaces of the cell gate pattern and the selection gate pattern after the metal silicide is formed.

The method may further include forming an interlayer insulating layer on the liner insulating layer and the spacers.

The method may include forming the liner insulating layer by one of thermal oxidation, chemical vapor deposition (CVD), and atomic layer deposition (ALD).

The method may further include forming a passivation layer on the metal layer, before the metal silicide is formed.

The method may further include performing chemical mechanical polishing after the gap fill layer is formed.

The method may include forming the liner insulating layer of a silicon oxide layer or a silicon nitride layer.

The method may include forming the metal layer of a material selected from the group consisting of cobalt, tungsten, titanium, nickel, and an alloy thereof.

In accordance with still another non-limiting aspect of the inventive concepts, a method of fabricating a semiconductor device may include forming at least one selection gate pattern on a substrate. Subsequently, a liner insulating layer may be formed on a surface of the selection gate pattern so as to have a first thickness. A gap fill layer may then be formed on the liner insulating layer by FCVD or SOG. The liner insulating layer and the gap fill layer may be recessed such that the liner insulating layer has a second thickness (which is smaller than the first thickness) in desired (or, alternatively, predetermined) upper and side regions of the selection gate pattern. The gap fill layer may be removed. A metal layer may be formed on the liner insulating layer. A metal silicide may be formed using the metal layer. In particular, the upper regions of the selection gate pattern may be transformed into a metal silicide using the metal layer. Subsequently, a spacer may be formed on a side surface of the selection gate pattern. A polishing stopper may be formed on the liner insulating layer and the spacer. An interlayer insulating layer may be formed on the polishing stopper.

In the method of fabricating the semiconductor device, after the liner insulating layer and the gap fill layer are recessed, a metal layer may be formed on the liner insulating layer and the gap fill layer. Afterwards, a metal silicide may be formed using the metal layer. A spacer may be formed on a side surface of the metal silicide.

The method may further include forming a cell gate pattern on the substrate so as to be spaced apart from the selection gate pattern. The cell gate pattern may include a tunnel insulating layer, a floating gate, an inter-gate insulating layer, and a control gate. Metal silicides may be formed on both the selection gate pattern and cell gate pattern.

The at least one selection gate pattern may include a string selection gate pattern and a ground selection gate pattern.

BRIEF DESCRIPTION OF THE DRAWINGS

The foregoing and other features and advantages of the inventive concepts may become more apparent when the description of the various example embodiments herein is read in conjunction with the accompanying drawings, in which like reference characters refer to the same parts throughout the different views. The drawings are not necessarily to scale, the emphasis instead being placed upon illustrating the principles of the inventive concepts. In the drawings:

FIGS. 2A to 2H are cross-sectional views sequentially illustrating a method of fabricating the semiconductor device according to the first example embodiment of the inventive concepts;

DETAILED DESCRIPTION OF THE EMBODIMENTS

Figure 1A:
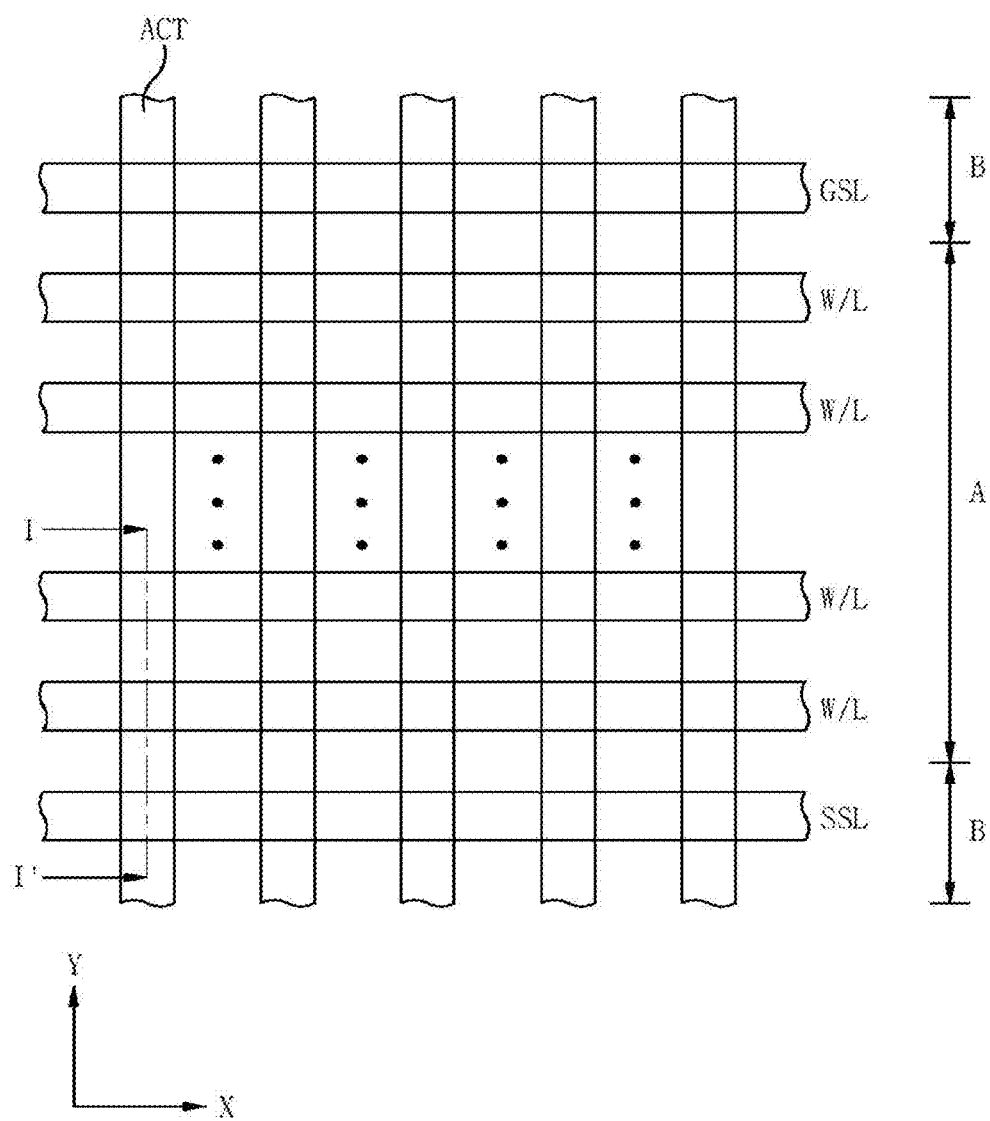
FIG. 1A is a plan view of a semiconductor device fabricated according to a first example embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are merely provided to ensure that this disclosure is thorough and complete and fully conveys the inventive concepts to those skilled in the art. In the drawings, the sizes and relative sizes of layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

(First Example Embodiment)

Figure 1B:
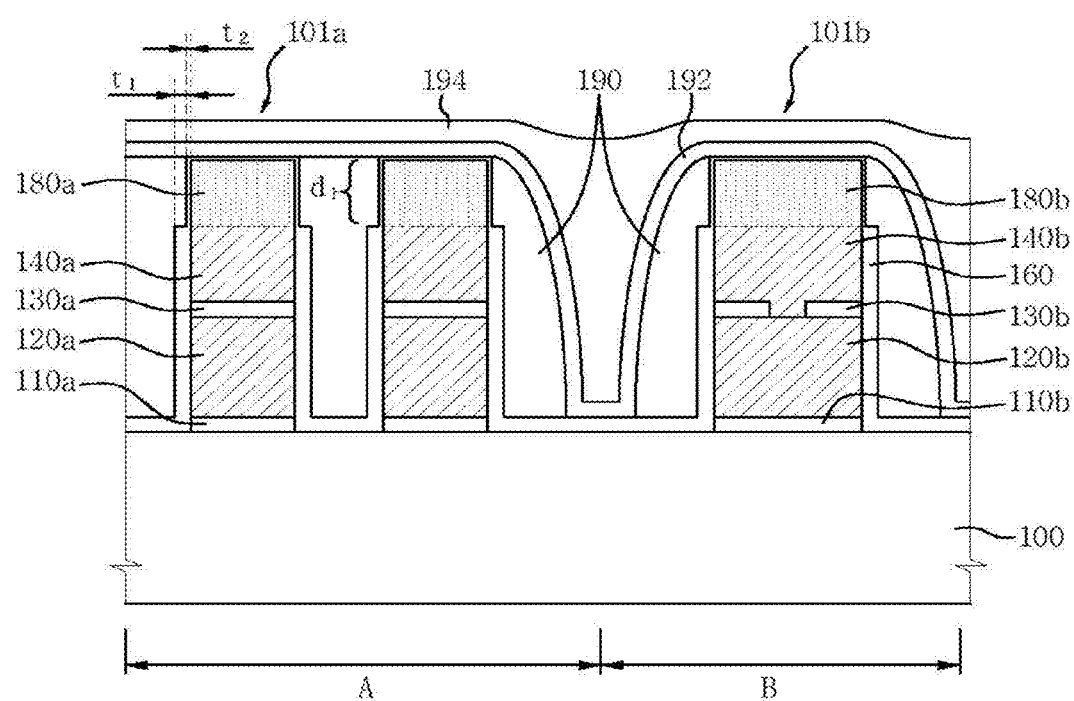
FIG. 1B is a cross-sectional view taken along line I-I' of FIG. 1A.

FIG. 1A is a plan view of a semiconductor device fabricated according to a first example embodiment of the inventive concepts, and FIG. 1B is a cross-sectional view taken along line I-I' of FIG. 1A.

Referring to FIGS. 1A and 1B, the semiconductor device fabricated by the method according to the first example embodiment of the inventive concepts may include a substrate 100 in which an active region ACT is defined by an isolation layer (not shown). The active region ACT may be repeatedly aligned in an X direction. The active region ACT may also extend in a Y direction perpendicular to the X direction.

The substrate 100 may further include a plurality of gate patterns 101a and 101b. Here, the active region ACT may include impurity regions (not shown) such as channel regions (not shown) disposed between and on a side surface of the adjacent gate patterns 101a and 101b.

The plurality of gate patterns 101a and 101b may include a cell gate pattern 101a disposed in a first region A of the substrate 100 and a selection gate pattern 101b disposed in a second region B of the substrate 100. Here, the selection gate pattern 101b may include a ground selection gate pattern connected to a ground selection line GSL and a string selection gate pattern connected to a string selection line SSL.

The cell gate pattern 101a may include a tunnel insulating layer 110a, a floating gate 120a, an inter-gate insulating layer 130a, and a control gate 140a. Here, in a desired (or, alternatively, predetermined) upper region d1 of the control gate 140a, a metal silicide 180a may be formed.

The tunnel insulating layer 110a may be formed of a silicon oxide layer or a silicon nitride layer. The inter-gate insulating layer 130a may be formed of a material selected from the group consisting of an oxide layer, a nitride layer, and a stacked layer thereof. In detail, the inter-gate insulating layer 130a may be formed of an ONO layer having a stacked structure (oxide/nitride/oxide) of an oxide layer, a nitride layer, and an oxide layer.

The floating gate 120a and a control gate 140a may be formed of poly-silicon (P-Si). The P-Si may be doped with N- or P-type impurities. The control gate 140a may configure a word line (W/L), which extends in the X direction and is repeatedly aligned in the Y direction.

The selection gate pattern 101b may include a gate insulating layer 110b, a lower selection gate pattern 120b, an inter-gate insulating pattern 130b, and an upper selection gate pattern 140b. In a desired (or, alternatively, predetermined) upper region d1 of the upper selection gate pattern 140b, a metal silicide 180b may be formed. Here, the desired (or, alternatively, predetermined) upper region d1 of the selection gate pattern 140b may be the same as the desired (or, alternatively, predetermined) upper region d1 of the cell gate pattern 140a. In other words, the metal silicide 180b of the selection gate pattern 101b may have the same thickness as the metal silicide 180a of the cell gate pattern 101a.

The gate insulating layer 110b, the lower selection gate pattern 120b, the inter-gate insulating pattern 130b, and the upper selection gate pattern 140b may be formed of the same materials as the tunnel insulating layer 110a, the floating gate 120a, the inter-gate insulating layer 130a, and the control gate 140a of the cell gate pattern 101a, respectively.

The upper selection gate pattern 140b of the ground selection gate pattern may extend in the X direction to configure the ground selection line GSL. The upper selection gate pattern 140b of the string selection gate pattern may extend in the X direction to configure the string selection line SSL.

A liner insulating layer 160 may be disposed on surfaces of the cell gate pattern 101a and the selection gate pattern 101b. The liner insulating layer 160 may be an oxide layer or a nitride layer. In detail, the liner insulating layer 160 may be formed of a thermal oxide layer such as a high temperature oxide (HTO) layer or a medium temperature oxide (MTO) layer, a silicon oxide layer, or a silicon nitride layer.

The liner insulating layer 160 may have a first thickness t1. However, the liner insulating layer 160 may have a second thickness t2 that is smaller than the first thickness t1 in the desired (or, alternatively, predetermined) upper and side regions of the cell gate pattern 101a and the selection gate pattern 101b. In other words, the cell gate pattern 101a and the selection gate pattern 101b on which the metal silicides 180a and 180b are disposed may be covered by the liner insulating layer 160 having the second thickness t2.

The first thickness t1 may be a thickness capable of inhibiting the formation of the metal silicides 180a and 180b. Thus, the first thickness t1 may exceed 30 Å. On the other hand, the second thickness t2 may be a thickness allowing the metal silicides 180a and 180b to be formed. Thus, the second thickness t2 may be 10 Å or less.

The semiconductor device fabricated by the method according to the first example embodiment of the inventive concepts may further include spacers 190 disposed on side surfaces of the cell gate pattern 101a and the selection gate pattern 101b, and an interlayer insulating layer 194 disposed on the liner insulating layer 160 and the spacer 190.

Here, the spacer 190 and the interlayer insulating layer 194 may be formed of a material selected from the group consisting of an oxide layer, a nitride layer, and a stacked layer thereof. The spacer 190 and the interlayer insulating layer 194 may be formed of the same material as each other. The spacer 190 disposed between the adjacent cell gate pattern 101a may fill a gap between the adjacent cell gate patterns 101a.

The semiconductor device fabricated by the method according to the first example embodiment of the inventive concepts may further include a polishing stopper 192 disposed between the liner insulating layer 160, the spacer 190, and the interlayer insulating layer 194. The polishing stopper 192 may be formed of a material selected from the group consisting of an oxide layer, a nitride layer, and a stacked combination layer thereof. Here, the polishing stopper 192 may be formed of a material having a different etch rate from the interlayer insulating layer 194.

FIGS. 2A to 2H are cross-sectional views sequentially illustrating a method of fabricating the semiconductor device according to the first example embodiment of the inventive concepts.

Figure 2A:
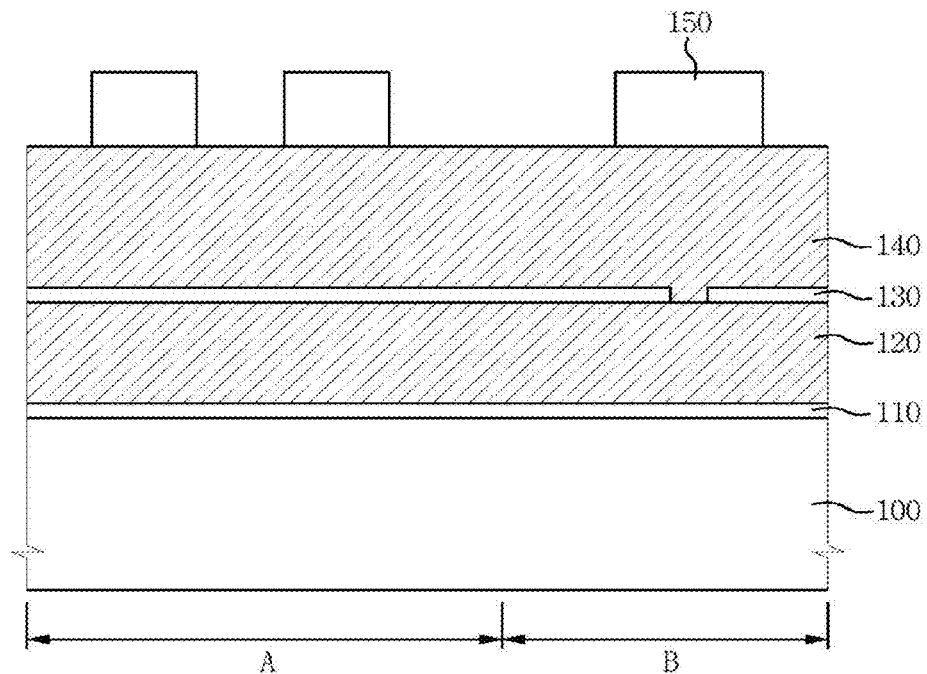

The method of fabricating the semiconductor device according to the first example embodiment of the inventive concepts will be described with reference to FIGS. 1B and 2A to 2H. First, the method, as shown in FIG. 2A, may include preparing a substrate 100 having a first region A and a second region B.

Subsequently, a first insulating layer 110, a first silicon layer 120, a second insulating layer 130, and a second silicon layer 140 may be sequentially formed on the substrate 100. Here, the second insulating layer 130 may be patterned to connect the first silicon layer 120 to the second silicon layer 140 in the second region B. After the first silicon layer 120 is patterned in the same shape as the active region ACT of FIG. 1A, the second insulating layer 130 and the second silicon layer 140 may be formed on the first silicon layer 120.

The first insulating layer 110 may be formed by thermal oxidation. The second insulating layer 130 may be formed of a material selected from the group consisting of an oxide layer, a nitride layer, and a stacked combination layer thereof. The first silicon layer 120 and the second silicon layer 140 may be formed of P-Si. The P-Si may be doped with N- or P-type impurities.

Afterwards, a hard mask pattern 150 may be formed on the second silicon layer 140. The hard mask pattern 150 may be formed of a material selected from the group consisting of an oxide layer, a nitride layer, and a stacked combination layer thereof. The hard mask pattern 150 may be formed by forming an insulating layer for a hard mask (not shown) on the second silicon layer 140, and patterning the insulating layer.

Figure 2B:
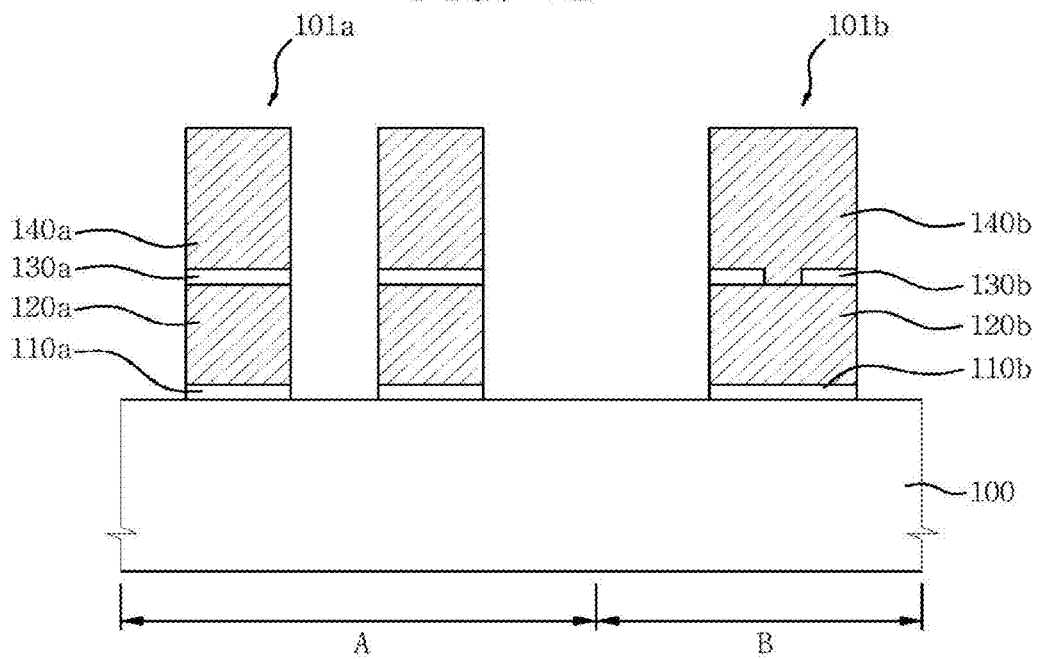

Subsequently, as shown in FIG. 2B, the first insulating layer 110, the first silicon layer 120, the second insulating layer 130, and the second silicon layer 140 may be etched using the hard mask pattern 150 as a mask, thereby forming a plurality of gate patterns 101a and 101b. The plurality of gate patterns 101a and 101b may include a cell gate pattern 101a disposed in the first region A and a selection gate pattern 101b disposed in the second region B.

The hard mask pattern 150 may be removed by cleaning according to the etching of the first insulating layer 110, the first silicon layer 120, the second insulating layer 130, and the second silicon layer 140. Here, the hard mask pattern 150 may be removed by subsequent recessing of the liner insulating layer 160 and the gap fill layer 170 or cleaning.

The method of fabricating the semiconductor device according to the first example embodiment of the inventive concepts may include doping impurities between the adjacent cell gate patterns 101a, between the cell gate pattern 101a and the selection gate pattern 101b, and into the active region ACT disposed on the periphery of the selection gate pattern 101b using the hard mask pattern 150 so as to form impurity regions (not shown).

In the method of fabricating the semiconductor device according to the first example embodiment of the inventive concepts, the impurity regions may be formed before a subsequent spacer or interlayer insulating layer forming process.

In the cell gate pattern 101a, the etched first insulating layer 110, first silicon layer 120, second insulating layer 130 and second silicon layer 140 may be used as a tunnel insulating layer 110a, a floating gate 120a, an inter-gate insulating layer 130a and a control gate 140a, respectively. In the selection gate pattern 101b, the etched first insulating layer 110, first silicon layer 120, second insulating layer 130, and second silicon layer 140 may be used as a gate insulating layer 110b, a lower selection gate pattern 120b, an inter-gate insulating pattern 130b, and an upper selection gate pattern 140b, respectively.

In other words, the first insulating layer 110, the first silicon layer 120, the second insulating layer 130, and the second silicon layer 140 in the first region A may form the tunnel insulating layer 110a, the floating gate 120a, the inter-gate insulating layer 130a, and the control gate 140a of the cell gate pattern 101a, respectively. Further, the first insulating layer 110, the first silicon layer 120, the second insulating layer 130, and the second silicon layer 140 in the second region B may form the gate insulating layer 110b, the lower selection gate pattern 120b, the inter-gate insulating pattern 130b, and the upper selection gate pattern 140b of the selection gate pattern 101b, respectively.

The cell gate pattern 101a and the selection gate pattern 101b may be simultaneously formed on the substrate 100. However, the cell gate pattern 101a and the selection gate pattern 101b may be formed by separate processes. Thus, in the method of fabricating the semiconductor device according to the first example embodiment of the inventive concepts, the cell gate pattern 101a and the selection gate pattern 101b may be formed by different processes from each other.

Figure 2C:
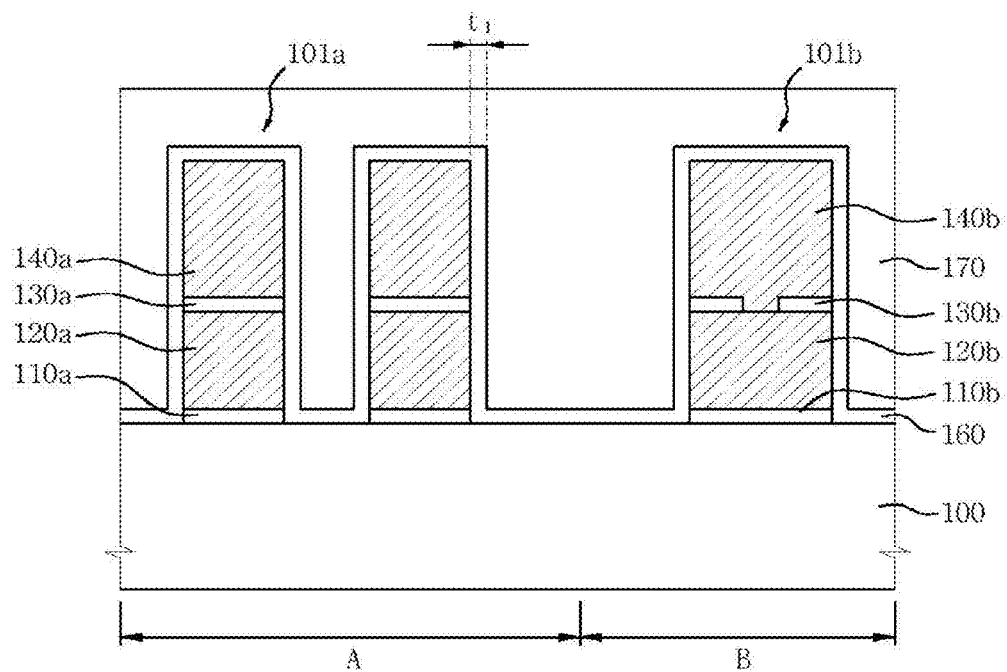

Subsequently, as shown in FIG. 2C, a liner insulating layer 160 having a first thickness t1 may be formed on surfaces of the plurality of gate patterns 101a and 101b. The liner insulating layer 160 may be formed by one of thermal oxidation, chemical vapor deposition (CVD), and atomic layer deposition (ALD).

The first thickness t1 may be a thickness capable of preventing formation of metal silicides 180a and 180b due to a metal layer 180 to be formed in a subsequent process. In other words, the liner insulating layer 160 having the first thickness t1 may inhibit a chemical reaction between the metal layer 180 and the control gate 140a or the upper selection gate pattern 140b. Thus, the first thickness t1 of the liner insulating layer 160 may exceed 30 Å. Here, the first thickness t1 of the liner insulating layer 160 may be 50 to 200 Å in consideration of subsequent processes such as recessing, cleaning and etching.

Subsequently, a gap fill layer 170 may be formed on the liner insulating layer 160 by FCVD or SOG. Generally, according to FCVD or SOG, an insulating layer may have high flowability. Thus, the gap fill layer 170 formed by FCVD or SOG may completely fill the gap between the adjacent gate patterns 101a and 101b.

Here, after the gap fill layer 170 is formed, it may be planarized. The planarization of the gap fill layer 170 may be accomplished by chemical mechanical polishing (CMP).

Figure 2D:
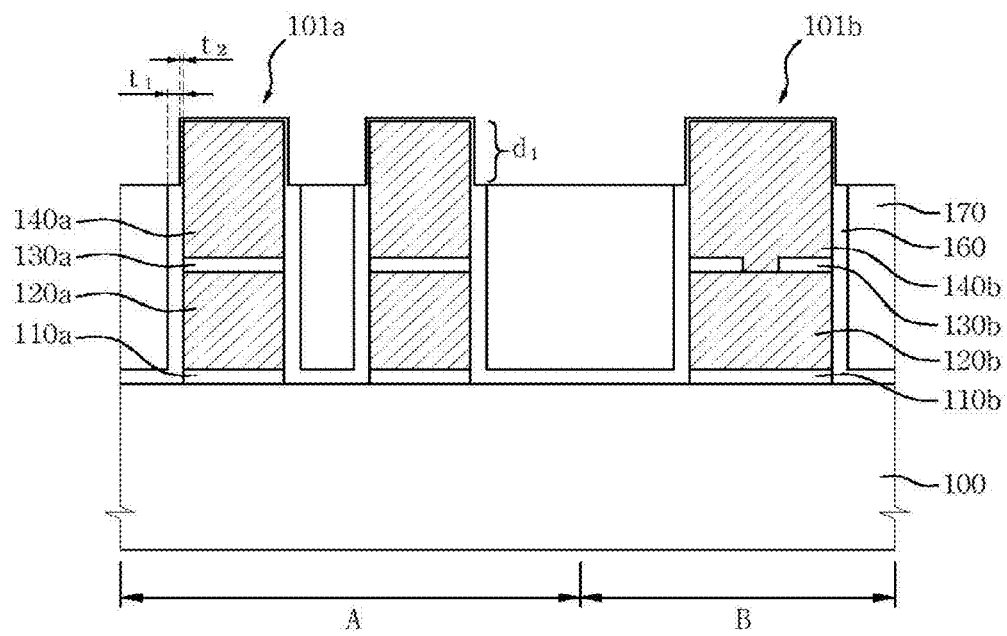

Subsequently, as shown in FIG. 2D, the liner insulating layer 160 and the gap fill layer 170 may be recessed such that the liner insulating layer 160 has a second thickness t2 smaller than the first thickness t1 in the desired (or, alternatively, predetermined) upper and side regions d1 of the plurality of gate patterns 101a and 101b.

The recess process may be performed by a dry cleaning method using $NH_3$ and HF or a dry etching method. The recess process may include ashing and stripping. The stripping may include organic stripping and HS stripping.

The second thickness t2 may be a thickness capable of inducing the formation of the metal silicides 180a and 180b by the chemical reaction between the metal layer 180 to be formed in a subsequent process and the control gate 140a or the upper selection gate pattern 140b. Thus, the second thickness t2 may be 10 Å or less. Here, the second thickness t2 of the liner insulating layer 160 may be 30 Å or less in consideration of subsequent processes such as cleaning and etching.

The gap fill layer 170 may be formed by FCVD or SOG to completely fill the gap between the adjacent gate patterns 101a and 101b. Accordingly, it can prevent a void in the insulating layer generated between the adjacent gate patterns 101a and 101b due to an increase in aspect ratio of the gate pattern. Thus, in the method of fabricating the semiconductor device according to the first example embodiment of the inventive concepts, the liner insulating layer 160 disposed on the surfaces of the plurality of gate patterns 101a and 101b may be uniformly recessed.

Here, the liner insulating layer 160 and the gap fill layer 170 may be simultaneously recessed. To this end, the gap fill layer 170 may be formed to have a higher etch rate than the liner insulating layer 160.

In this case, when the liner insulating layer 160 and the gap fill layer 170 are simultaneously recessed, the gap fill layer 170 may be removed faster than the liner insulating layer 160. As a result, while a part of the liner insulating layer 160 remains in the desired (or, alternatively, predetermined) upper and side regions d1 of the plurality of gate patterns 101a and 101b, the gap fill layer 170 may be completely recessed.

Table 1 shows the etch rates of oxide layers formed according to various deposition processes. Here, the unit of the etch rate is Å/min. As previously noted, terms "SOG" and "FCVD" are acronyms for "spin-on-glass" and "flowable chemical vapor deposition," respectively. Furthermore, the term "C-FCVD" refers to a FCVD forming a carbon-containing insulating layer.

TABLE 1

| Etching Condition | Thermal Oxide Layer | SOG | FCVD | C-FCVD |
| --- | --- | --- | --- | --- |
| 200:1HF | 13 | 50 | 54 | 225 |
| $O_3HF$ | 8 | 14 | 21 | 126 |

Referring to Table 1, the oxide layers formed by FCVD and SOG have higher etch rates than the thermal oxide layer. Thus, when the liner insulating layer 160 is formed by thermal oxidation, the liner insulating layer 160 and the gap fill layer 170 may be simultaneously recessed.

Referring again to Table 1, the carbon-containing oxide layer formed by C-FCVD has a higher etch rate than the oxide layers formed by FCVD and SOG. Thus, when the gap fill layer 170 is formed by C-FCVD without taking the method of forming the liner insulating layer 160 into consideration, the liner insulating layer 160 and the gap fill layer 170 may be simultaneously recessed.

As noted above, the liner insulating layer 160 and the gap fill layer 170 may be sequentially recessed. In further detail, the gap fill layer 170 may be first recessed by dry cleaning or dry etching to expose the liner insulating layer 160 in the desired (or, alternatively, predetermined) upper and side regions d1 of the plurality of gate patterns 101a and 101b. Then, the liner insulating layer 160 may be recessed to have the second thickness t2 in the desired (or, alternatively, predetermined) upper and side regions d1 of the plurality of gate patterns 101a and 101b.

Subsequently, as shown in FIG. 2E, the gap fill layer 170 disposed on the liner insulating layer 160 may be removed.

Thus, the gap fill layer 170 may be formed to have a different etch characteristic from the liner insulating layer 160. In addition, when the gap fill layer 170 is formed to have a higher etch rate than the liner insulating layer 160, the gap fill layer 170 may be more easily removed.

The removal of the gap fill layer 170 may be accomplished by wet cleaning using HF and DSC or wet etching using $O_3HF$.

In the method of fabricating the semiconductor device according to the first example embodiment of the inventive concepts, the gap fill layer 170 may be completely removed. Alternatively, the gap fill layer 170 may only be partially removed.

As shown in FIG. 2F, a metal layer 180 may be formed on the liner insulating layer 160. The metal layer 180 may be formed of a material selected from the group consisting of cobalt (Co), tungsten (W), titanium (Ti), nickel (Ni), and an alloy thereof. The metal layer 180 may be formed by physical vapor deposition (PVD), CVD, or ALD.

A passivation layer 185 may be further formed on the meal layer 180. The passivation layer 185 may prevent oxidation of the metal layer 180. The passivation layer 185 may be formed of titanium nitride ($TiN_x$). The passivation layer 185 may be formed by CVD or ALD.

Figure 2G:
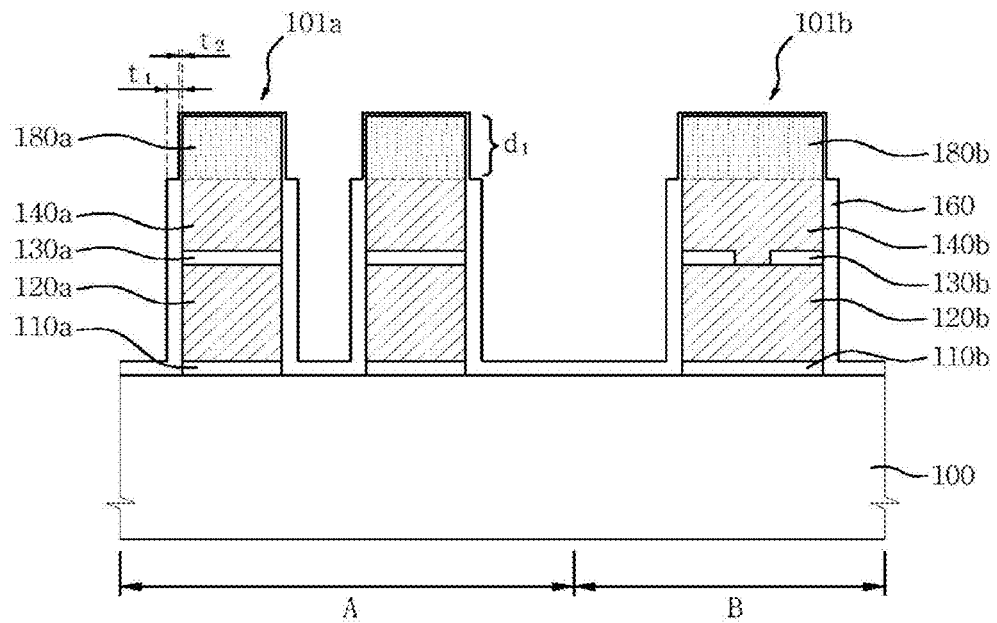

As shown in FIG. 2G, metal silicides 180a and 180b may be formed using the metal layer 180. Here, as described above, the liner insulating layer 160 having the first thickness t1 may inhibit the formation of the metal silicides 180a and 180b. Thus, the metal silicides 180a and 180b may be formed only in the desired (or, alternatively, predetermined) upper regions d1 of the cell gate pattern 101a and the selection gate pattern 101b covered by the liner insulating layer 160 having the second thickness t2.

The metal silicides 180a and 180b may be formed by thermally treating the substrate 100. The thermal treatment may be performed by several processes.

Figure 2H:
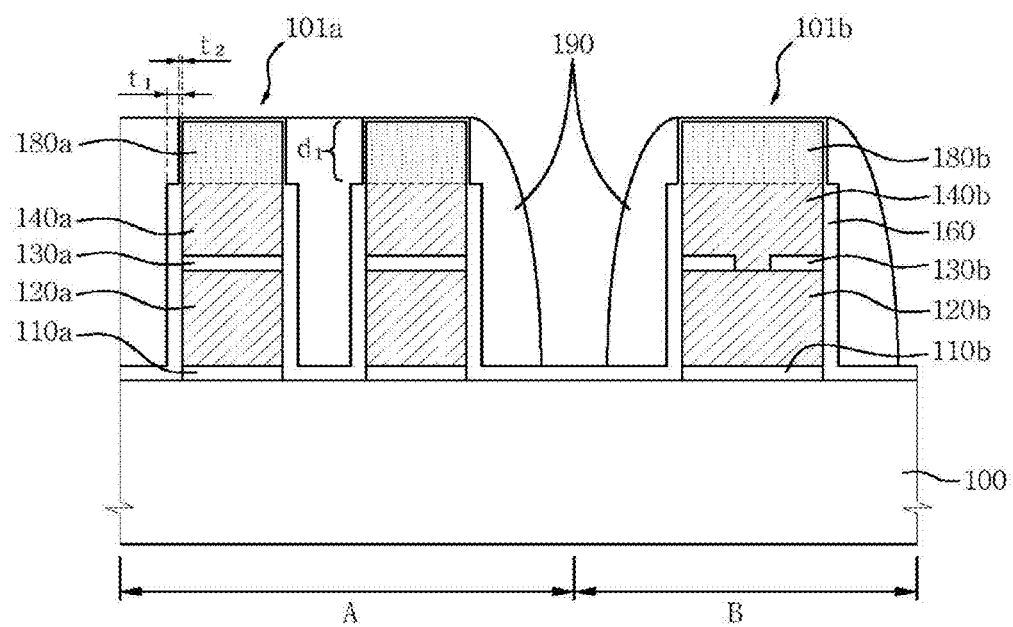

As shown in FIG. 2H, spacers 190 may be formed on side surfaces of the cell gate pattern 101a and the selection gate pattern 101b. The spacer 190 may be formed of a middle temperature oxide (MTO) layer by thermal oxidation. Here, after the remaining metal layer 180 and passivation layer 185 are removed, the spacers 190 may be formed.

As shown in FIG. 1B, an interlayer insulating layer 194 may be formed on the liner insulating layer 160 and the spacers 190, and thus the semiconductor device fabricated by the method according to the first example embodiment of the inventive concepts may be completed.

A polishing stopper 192 may also be formed between the liner insulating layer 160, the spacers 190, and the interlayer insulating layer 194. The polishing stopper 192 may be formed of a material having a different etch rate from the interlayer insulating layer 194. For instance, the polishing stopper 192 may be formed of a nitride layer, and the interlayer insulating layer 194 may be formed of an oxide layer, although example embodiments are not limited thereto.

Figure 3A:
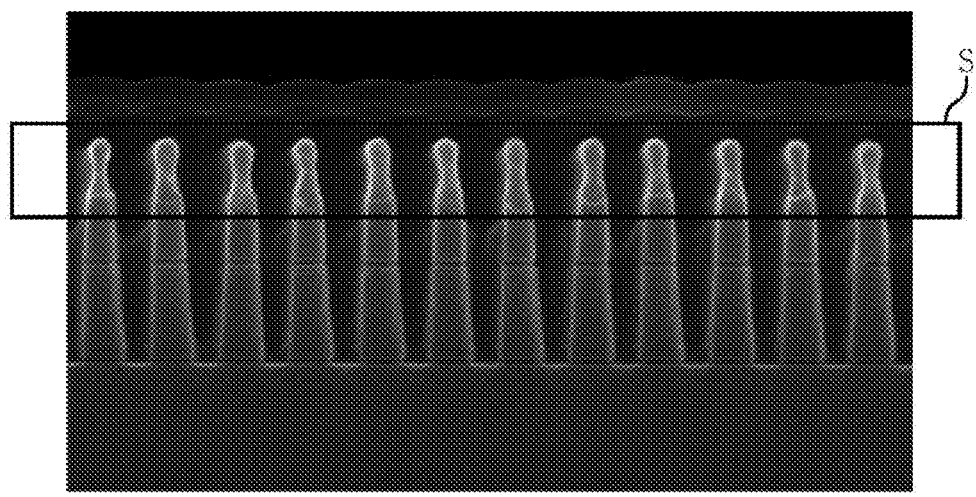
FIG. 3A is a virtual scanning electron microscope (VSEM) picture of a semiconductor device fabricated by a conventional method.
Figure 3B:
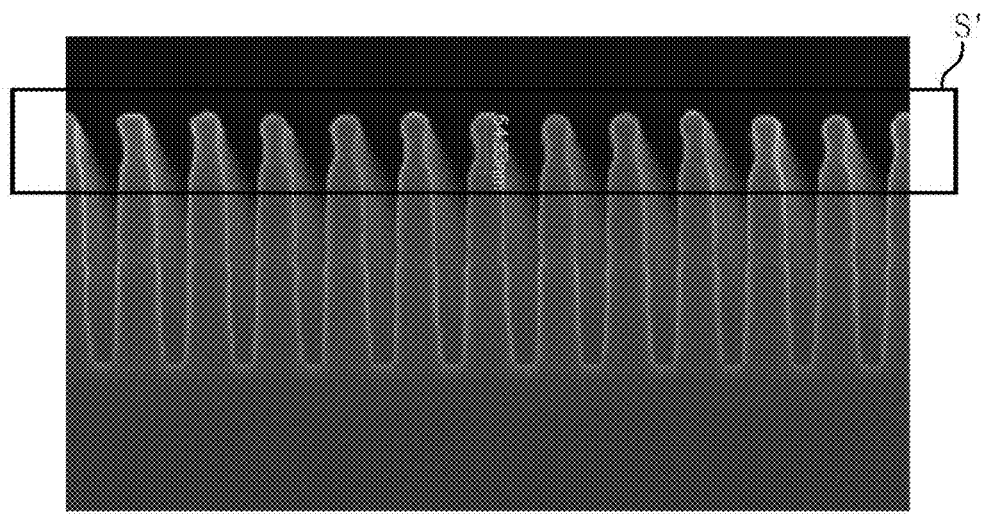
FIG. 3B is a VSEM picture of a semiconductor device fabricated by the method according to the first example embodiment of the inventive concepts.

FIG. 3A is a virtual scanning electron microscope (VSEM) picture of a semiconductor device fabricated by a conventional method, and FIG. 3B is a VSEM picture of a semiconductor device fabricated by the method according to the first example embodiment of the inventive concepts.

Referring to FIG. 3A, it can be seen that, in the semiconductor device formed according to a conventional method, the metal silicides S formed on the gate patterns have different thicknesses from each other. On the other hand, referring to FIG. 3B, it can be seen that, in the semiconductor device formed according to the first example embodiment of the inventive concepts, the metal silicides S' formed on the gate patterns have relatively uniform thicknesses.

Thus, compared to a conventional method, it can be seen that the method of fabricating the semiconductor device according to the first example embodiment of the inventive concepts forms the metal silicides to have relatively uniform thicknesses in desired (or, alternatively, predetermined) upper regions of the gate patterns.

Figure 4:
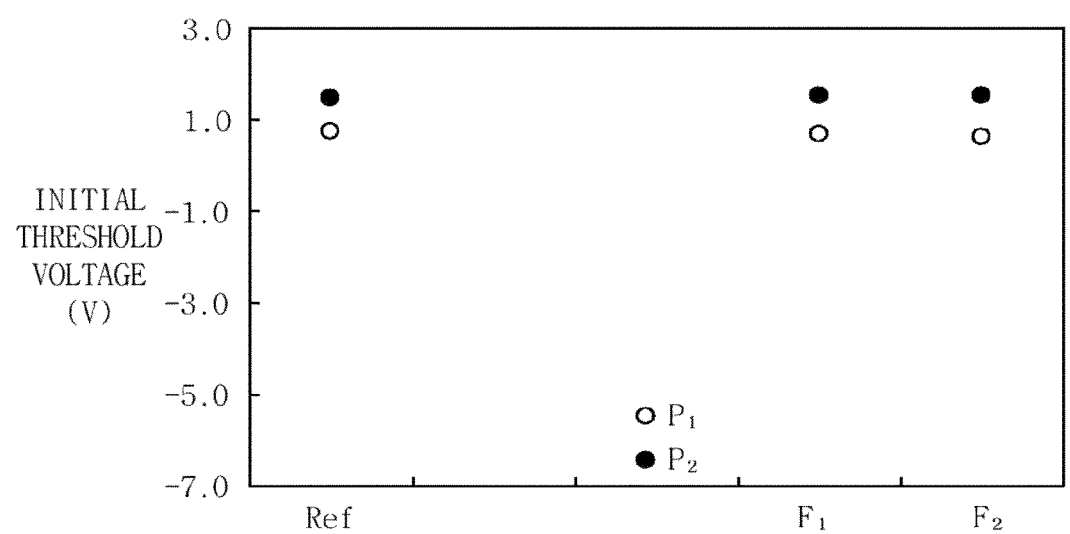
FIG. 4 is a graph showing initial threshold voltages of the semiconductor device having a gap fill layer formed by carbon-flowable chemical vapor deposition (C-FCVD), which are fabricated by the method according to the first example embodiment of the inventive concepts, and the semiconductor device fabricated by the conventional method.

FIG. 4 is a graph of initial threshold voltages of semiconductor devices (F1 and F2) having a gap fill layer formed by C-FCVD, which are fabricated by the method according to the first example embodiment of the inventive concepts, and a semiconductor device (Ref) fabricated by a conventional method. Here, in FIG. 4, the initial threshold voltages of the semiconductor devices F1 and F2 according to the first example embodiment of the inventive concepts and the semiconductor device Ref according to the conventional method are measured from two different patterns P1 and P2.

Referring to FIG. 4, regardless of the change in pattern, it can be seen that the semiconductor devices F1 and F2 formed by the method according to the first example embodiment of the inventive concepts and the semiconductor device Ref according to the conventional method have the same initial threshold voltage.

Thus, it can be seen that, although the gap fill layer may be formed by C-FCVD in the method of fabricating the semiconductor device according to the first example embodiment of the inventive concepts, the current characteristics of the semiconductor device are not deteriorated.

As a result, according to the method of fabricating the semiconductor device according to the first example embodiment of the inventive concepts, the liner insulating layer may be formed to have different thicknesses in the region in which the metal silicides are formed on surfaces of the plurality of gate patterns using the liner insulating layer and the gap fill layer formed by FCVD or SOG, and in the other regions. Thus, according to the method of fabricating the semiconductor device according to the first example embodiment of the inventive concepts, the metal silicides may be formed to relatively uniform thicknesses in the desired (or, alternatively, predetermined) upper regions of the plurality of gate patterns.

(Second Example Embodiment)

FIGS. 5A to 5G are cross-sectional views sequentially illustrating a method of fabricating a semiconductor device according to a second example embodiment of the inventive concepts.

Figure 5A:
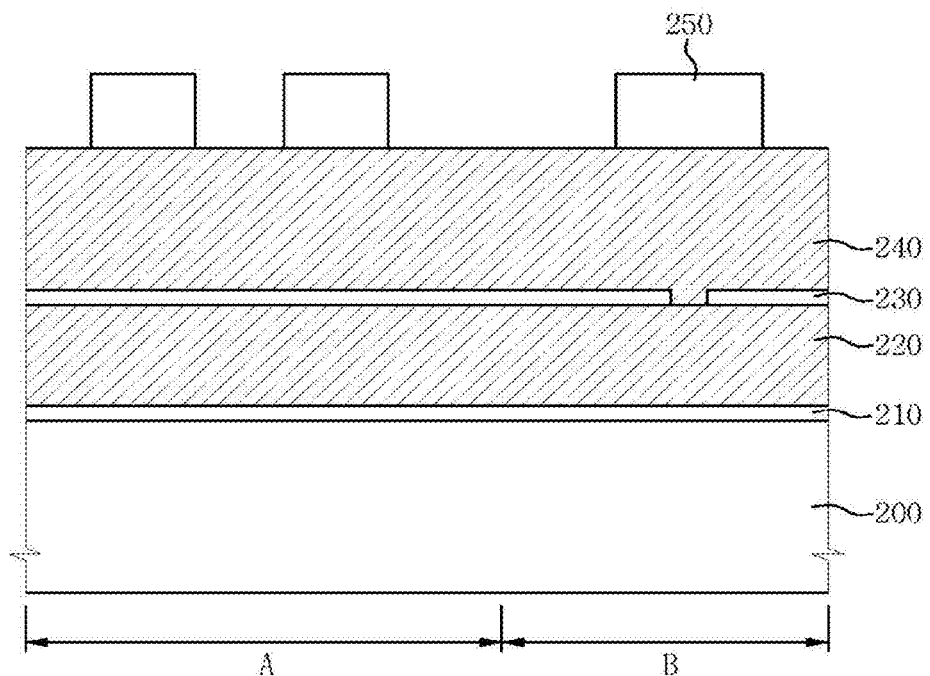
FIGS. 5A to 5G are cross-sectional views sequentially illustrating a method of fabricating a semiconductor device according to a second example embodiment of the inventive concepts.

The method of fabricating the semiconductor device according to the second example embodiment of the inventive concepts will be described with reference to FIGS. 5A to 5G. First, in the method according to the second example embodiment of the inventive concepts, as shown in FIG. 5A, a substrate 200 having a first region A and a second region B may be prepared. Here, the first region A of the substrate 200 may be a region in which a cell gate pattern 201a is formed by a subsequent process. In addition, the second region B of the substrate 200 may be a region in which a selection gate pattern 201b is formed by a subsequent process.

A third insulating layer 210 may be formed on the substrate 200. The third insulating layer 210 may be a silicon oxide layer or a silicon nitride layer. The third insulating layer 210 may be formed by thermal oxidation. However, it should be understood that example embodiments are not limited to the above materials or method of forming.

A third silicon layer 220 may be formed on the third insulating layer 210. The third silicon layer 220 may be formed of P-Si. The P-Si may be doped with N- or P-type impurities.

Subsequently, a fourth insulating layer 230 may be formed on the third silicon layer 220. The fourth insulating layer 230 may be formed of a material selected from the group consisting of an oxide layer, a nitride layer, and a stacked combination layer thereof. For example, the fourth insulating layer 230 may be formed of an ONO layer having a stacked structure of an oxide layer, a nitride layer, and an oxide layer.

A fourth silicon layer 240 may be formed on the fourth insulating layer 230. The fourth silicon layer 240 may be formed of P-Si doped with N- or P-type impurities. Here, the fourth insulating layer 230 in the second region B may be patterned such that the third silicon layer 220 is in contact with the fourth silicon layer 240.

The third insulating layer 210, the third silicon layer 220, the fourth insulating layer 230, and the fourth silicon layer 240 may be as described in connection with the first insulating layer 110, the first silicon layer 120, the second insulating layer 130, and the second silicon layer 140 of the first example embodiment of the inventive concepts.

A hard mask pattern 250 may be formed on the fourth silicon layer 240. The hard mask pattern 250 may be formed by forming an insulating layer for a hard mask (not shown) on the fourth silicon layer 240, and patterning the insulating layer.

Figure 5B:
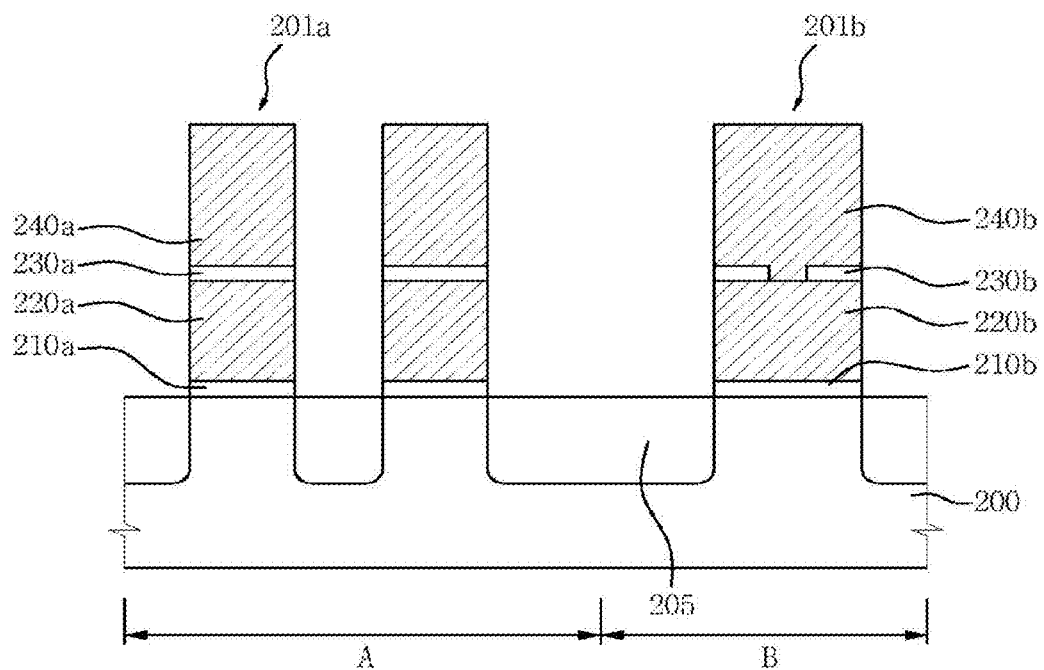

Subsequently, as shown in FIG. 5B, the third insulating layer 210, the third silicon layer 220, the fourth insulating layer 230, and the fourth silicon layer 240 may be etched using the hard mask pattern 250 as a mask to form a plurality of gate patterns 201a and 201b. The plurality of gate patterns 201a and 201b may include a cell gate pattern 201a disposed in the first region A and a selection gate pattern 201b disposed in the second region B.

Here, the cell gate pattern 201a may include a tunnel insulating layer 210a, a floating gate 220a, an inter-gate insulating layer 230a, and a control gate 240a. The selection gate pattern 201b may include a gate insulating layer 210b, a lower selection gate pattern 220b, an inter-gate insulating pattern 230b, and an upper selection gate pattern 240b.

Thus, the third insulating layer 210, the third silicon layer 220, the fourth insulating layer 230, and the fourth silicon layer 240 in the first region A may form the tunnel insulating layer 210a, the floating gate 220a, the inter-gate insulating layer 230a, and the control gate 240a of the cell gate pattern 201a, respectively. The third insulating layer 210, the third silicon layer 220, the fourth insulating layer 230, and the fourth silicon layer 240 in the second region B may form the gate insulating layer 210b, the lower selection gate pattern 220b, the inter-gate insulating pattern 230b, and the upper selection gate pattern 240b of the selection gate pattern 201b.

The cell gate pattern 201a and the selection gate pattern 201b may be simultaneously formed on the substrate 200. However, it should be understood that the cell gate pattern 201a and the selection gate pattern 201b may be sequentially formed by separate processes, respectively. In the method of fabricating the semiconductor device according to the second example embodiment of the inventive concepts, the cell gate pattern 201a and the selection gate pattern 201b may be formed by different processes from each other.

Subsequently, impurities may be doped between the adjacent cell gate patterns 201a, between the cell gate pattern 201a and the selection gate pattern 201b, and into a peripheral active region (not shown) of the selection gate pattern 201b using the hard mask pattern 250, thereby forming impurity regions 205.

Figure 5C:
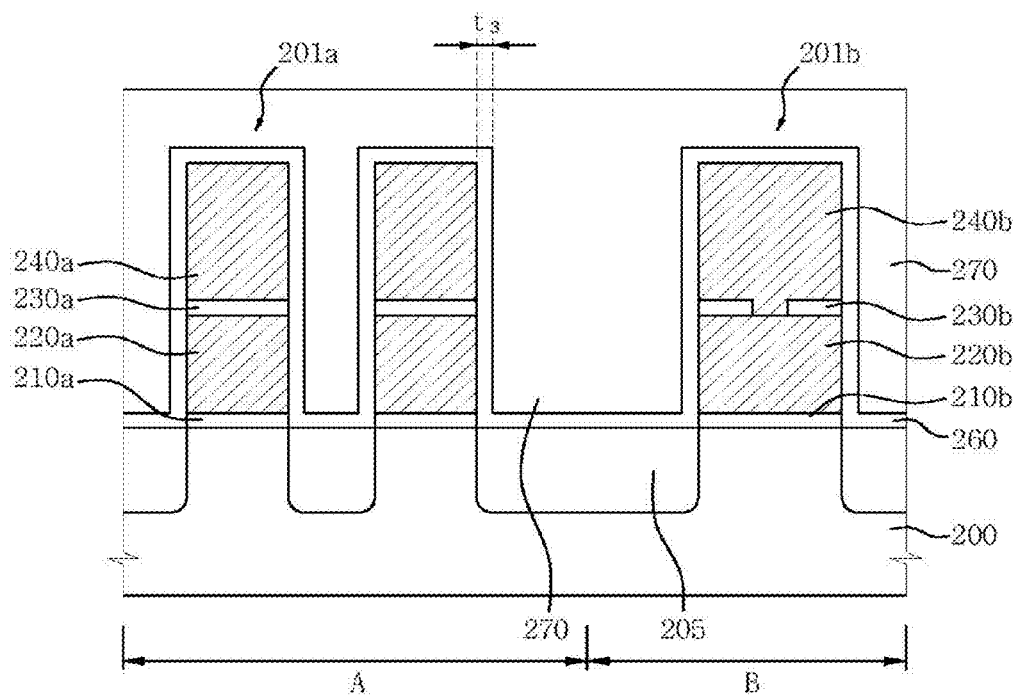

As shown in FIG. 5C, a liner insulating layer 260 may be formed to a third thickness t3 on the plurality of gate patterns 201a and 201b. The liner insulating layer 260 may be one of a thermal oxide layer such as an HTO layer or an MTO layer, a silicon oxide layer, and a silicon nitride layer. The liner insulating layer 260 may be formed by one of thermal oxidation, CVD, and ALD.

The third thickness t3 (which corresponds to the first thickness t1 described in the first example embodiment of the inventive concepts) may be a thickness capable of inhibiting formation of metal silicides 280a and 280b. Thus, the third thickness t3 may exceed 30 Å like the first thickness t1. The third thickness t3 of the liner insulating layer 260 may be 50 to 200 Å in consideration of subsequent processes such as recessing, cleaning, and etching.

Subsequently, a gap fill layer 270 may be formed on the liner insulating layer 260 by FCVD or SOG. As described above, the gap fill layer 270 formed by FCVD or SOG may completely fill a gap between the adjacent gate patterns 201a and 201b.

Here, after the gap fill layer 270 is formed, it may be planarized by CMP.

Figure 5D:
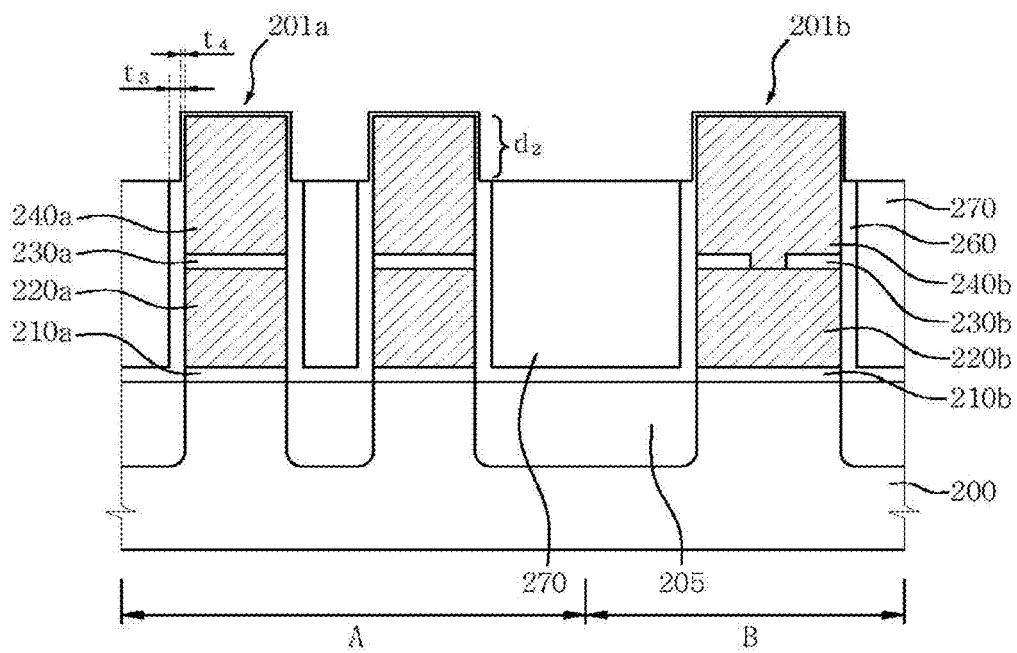

Subsequently, as shown in FIG. 5D, the liner insulating layer 260 and the gap fill layer 270 may be recessed such that the liner insulating layer 260 has a fourth thickness t4 that is smaller than the third thickness t3 in the desired (or, alternatively, predetermined) upper and side regions d2 of the plurality of gate patterns 201a and 201b.

The fourth thickness t4 (which corresponds to the second thickness t2 described in the first example embodiment of the inventive concepts) may be a thickness capable of forming the metal silicides 280a and 280b. The fourth thickness t4 may be 10 Å or less, which may be the same as the second thickness t2. The fourth thickness t4 may be 30 Å or less in consideration of subsequent processes such as cleaning and etching.

The recess process may use dry cleaning using $NH_3$ and HF or dry etching. The recess process may also include ashing and stripping. For instance, the recess process may include organic stripping and HS stripping, although example embodiments are not limited thereto.

The liner insulating layer 260 and the gap fill layer 270 may be simultaneously recessed. To this end, the liner insulating layer 260 and the gap fill layer 270 may have different etch rates from each other.

As described in the first example embodiment of the inventive concepts, when the liner insulating layer 260 is formed by thermal oxidation, the liner insulating layer 260 and the gap fill layer 270 may be simultaneously recessed. When the gap fill layer 270 is formed by C-FCVD, regardless of the method of forming the liner insulating layer 260, the liner insulating layer 260 and the gap fill layer 270 may be simultaneously recessed.

Alternatively, the liner insulating layer 260 and the gap fill layer 270 may be sequentially recessed.

Figure 5E:
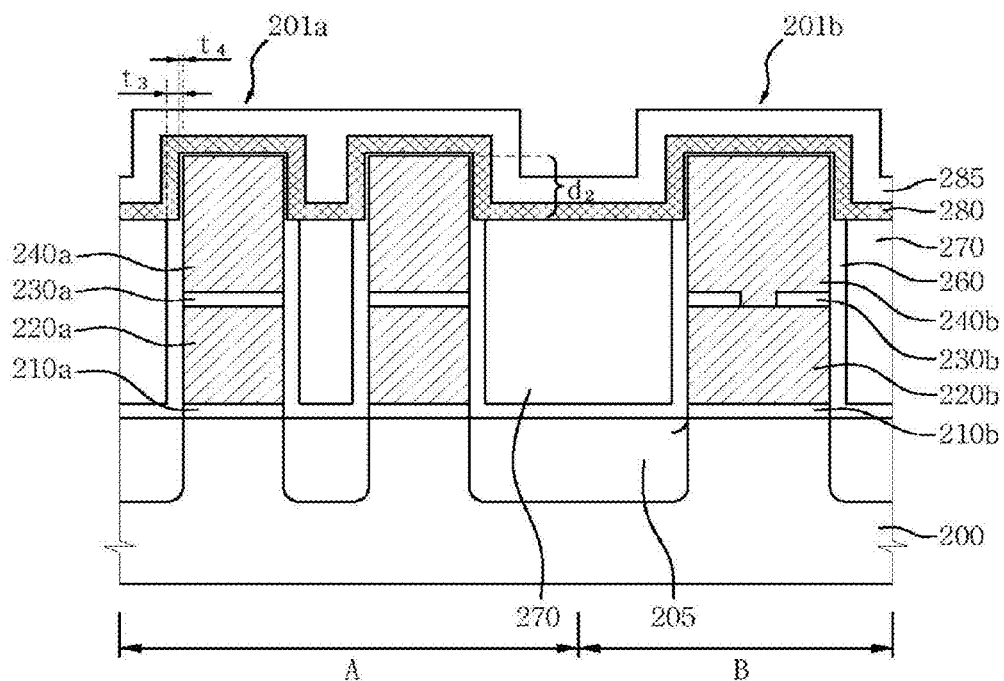

Subsequently, as shown in FIG. 5E, a metal layer 280 may be formed on the liner insulating layer 260 and the gap fill layer 270. The metal layer 280 may be formed from a material selected from the group consisting of cobalt (Co), tungsten (W), titanium (Ti), nickel (Ni), and an alloy thereof. The metal layer 280 may be formed by one of PVD, CVD, and ALD.

A passivation layer 285 may be further formed on the metal layer 280. The passivation layer 285 may prevent oxidation of the metal layer 280. The passivation layer 285 may be formed of titanium nitride ($TiN_x$). The passivation layer 285 may be formed by CVD or ALD.

Figure 5F:
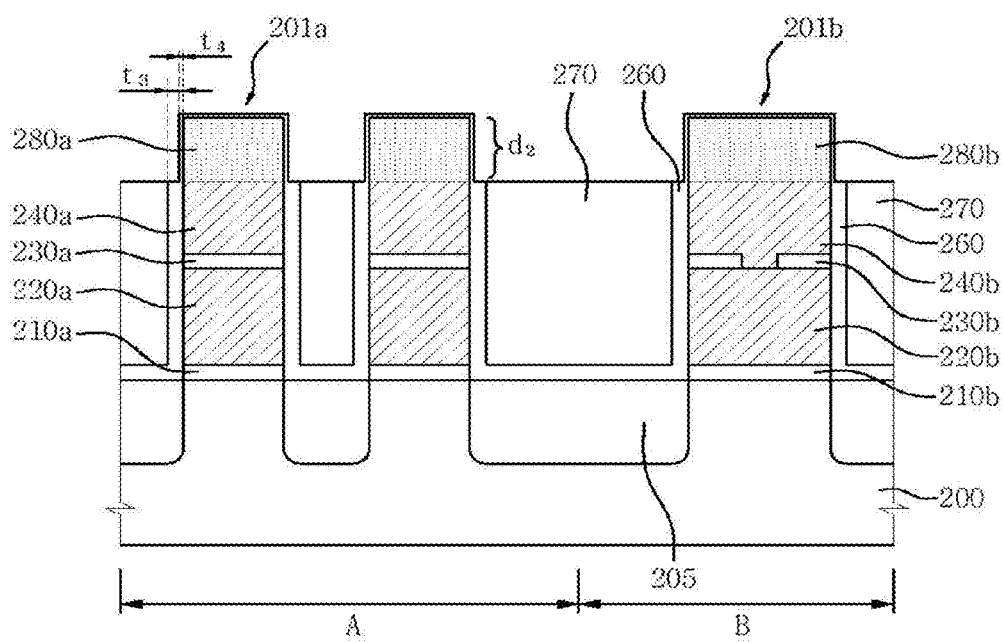

Subsequently, as shown in FIG. 5F, the metal silicides 280a and 280b may be formed using the metal layer 280. Here, as described in the first example embodiment of the inventive concepts, the metal silicides 280a and 280b may be formed only in a desired (or, alternatively, predetermined) upper region d2 of the cell gate pattern 201a and the selection gate pattern 201b covered with the liner insulating layer 260 having the fourth thickness t4.

Figure 5G:
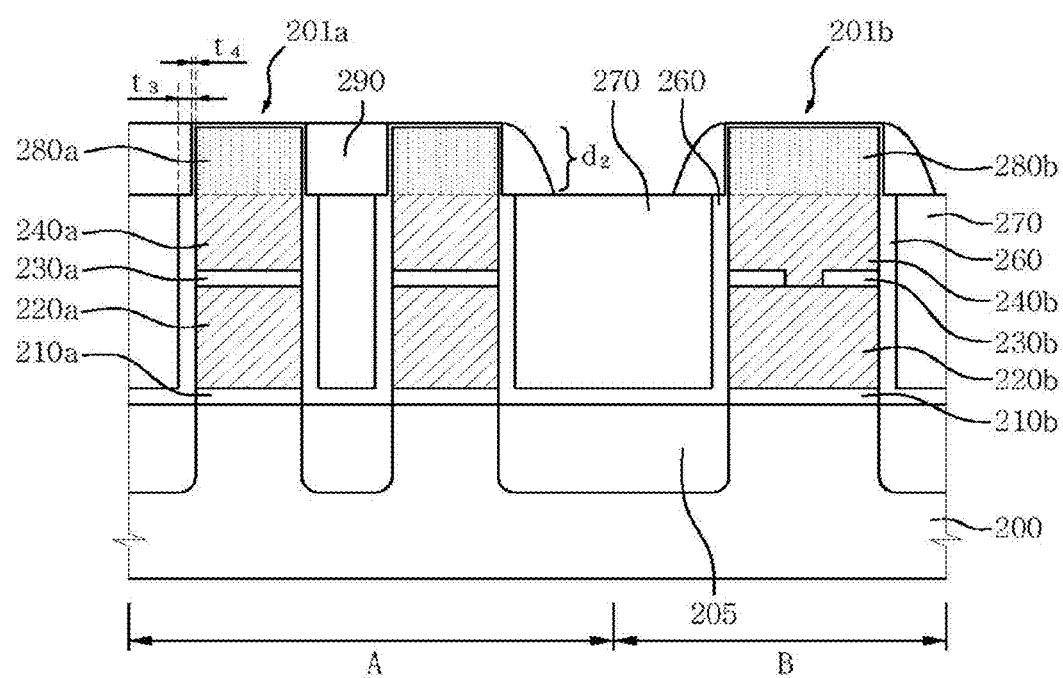

As shown in FIG. 5G, after the metal silicides 280a and 280b are formed, the remaining metal layer 280 and passivation layer 285 may be removed. Subsequently, spacers 290 may be formed on side surfaces of the metal silicides 280a and 280b. The spacers 290 may be formed of an MTO layer by thermal oxidation.

Although not shown, an interlayer insulating layer (not shown) may be formed on the liner insulating layer 260, the gap fill layer 270, and the spacers 290, and thus the semiconductor device formed by the method according to the second example embodiment of the inventive concepts may be completed.

A polishing stopper (not shown) may be further formed between the liner insulating layer 260, the gap fill layer 270, the spacers 290, and the interlayer insulating layer. The polishing stopper may be formed of a material having a different etch rate from the interlayer insulating layer.

As a result, the liner insulating layer may be formed to different thicknesses in the region in which the metal silicides are formed on the surfaces of the plurality of gate patterns and in the other regions. Further, the metal layer may be formed without removing the gap fill layer filling the gap between the adjacent gate patterns. Accordingly, the metal silicides having a relatively uniform thickness in the desired (or, alternatively, predetermined) upper regions of the plurality of gate patterns may be formed using a simpler process in the method of fabricating the semiconductor device according to the second example embodiment of the inventive concepts.

(Third Example Embodiment)

Figure 6A:
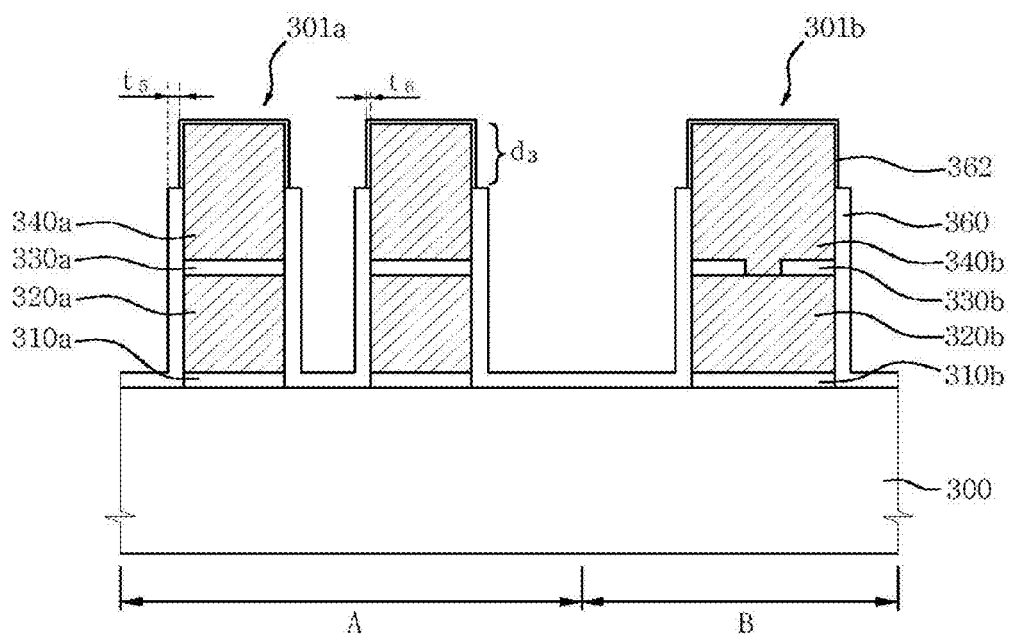
FIGS. 6A and 6B are cross-sectional views illustrating a method of fabricating a semiconductor device according to a third example embodiment of the inventive concepts.
Figure 6B:
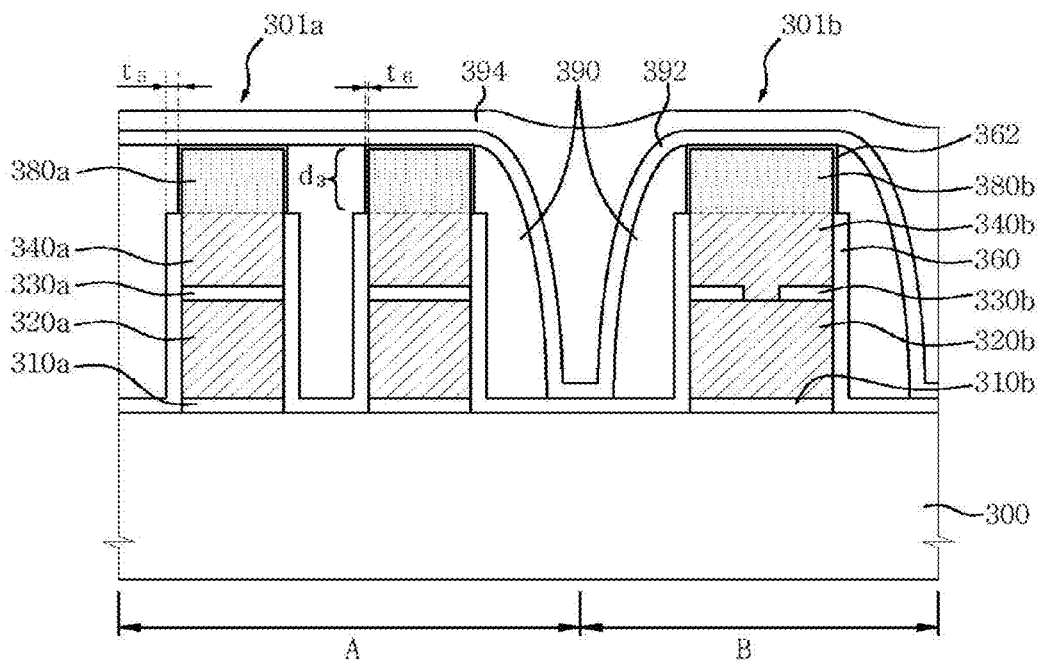

FIGS. 6A and 6B are cross-sectional views illustrating a method of fabricating a semiconductor device according to a third example embodiment of the inventive concepts.

The method of fabricating the semiconductor device according to the third example embodiment of the inventive concepts will be described with reference to FIGS. 6A and 6B. First, as shown in FIG. 6A, a substrate 300 having a first region A and a second region B may be prepared. Here, the first region A of the substrate 300 may be a region in which a cell gate pattern 301a is formed by a subsequent process. The second region B of the substrate 300 may be a region in which a selection gate pattern 301b is formed by a subsequent process.

Subsequently, a fifth insulating layer (not shown), a fifth silicon layer (not shown), a sixth insulating layer (not shown), and a sixth silicon layer (not shown) may be sequentially formed on the substrate 300. The fifth insulating layer, the fifth silicon layer, the sixth insulating layer, and the sixth silicon layer may correspond to the first insulating layer 110, the first silicon layer 120, the second insulating layer 130, and the second silicon layer 140 described in the first example embodiment of the inventive concepts. Thus, the descriptions of the fifth insulating layer, the fifth silicon layer, the sixth insulating layer, and the sixth silicon layer will be omitted herein for purposes of brevity.

A hard mask pattern (not shown) may be formed on the sixth silicon layer. The hard mask pattern may be formed of a material selected from the group consisting of an oxide layer, a nitride layer, and a stacked combination layer thereof. The hard mask pattern may be formed by forming an insulating layer for a hard mask (not shown) on the sixth silicon layer, and patterning the insulating layer.

Subsequently, the fifth insulating layer, the fifth silicon layer, the sixth insulating layer, and the sixth silicon layer may be etched using the hard mask pattern as a mask to form a plurality of gate patterns 301a and 301b. The plurality of gate patterns 301a and 301b may include a cell gate pattern 301a disposed in the first region A and a selection gate pattern 301b disposed in the second region B.

Here, the cell gate pattern 301a may include a tunnel insulating layer 310a, a floating gate 320a, an inter-gate insulating layer 330a, and a control gate 340a. The selection gate pattern 301b may include a gate insulating layer 310b, a lower selection gate pattern 320b, an inter-gate insulating pattern 330b, and an upper selection gate pattern 340b.

The cell gate pattern 301a and the selection gate pattern 301b may be simultaneously formed on the substrate 300. However, it should be understood that the cell gate pattern 301a and the selection gate pattern 301b may also be formed by separate processes, respectively. In the method of fabricating the semiconductor device according to the third example embodiment of the inventive concepts, the cell gate pattern 301a and the selection gate pattern 301b may be formed by different processes from each other.

Impurities may be doped between the adjacent cell gate patterns 301a, between the cell gate pattern 301a and the selection gate pattern 301b, and into a peripheral active region (not shown) of the selection gate pattern 301b using the hard mask pattern, thereby forming impurity regions (not shown).

Subsequently, a liner insulating layer 360 may be formed to a fifth thickness t5 on the plurality of gate patterns 301a and 301b. The liner insulating layer 360 may be formed of one of a thermal oxide layer such as an HTO layer or an MTO layer, a silicon oxide layer, and a silicon nitride layer. The liner insulating layer 360 may be formed by one of thermal oxidation, CVD, and ALD.

The fifth thickness t5 (which corresponds to the first thickness t1 according to the first example embodiment of the inventive concepts) may be a thickness capable of inhibiting the formation of metal silicides 380a and 380b. Thus, the fifth thickness t5 may exceed 30 Å, which may be the same as the first thickness t1. For example, the fifth thickness t5 may be 50 to 200 Å in consideration of processes such as recession, cleaning, and etching.

Subsequently, a gap fill layer (not shown) may be formed on the liner insulating layer 360 by FCVD or SOG. As described above, the gap fill layer formed by FCVD or SOG may completely fill a gap between the adjacent gate patterns 301a and 301b.

After the gap fill layer is formed, it may be planarized by CMP.

Subsequently, the liner insulating layer 360 and the gap fill layer may be recessed to expose the desired (or, alternatively, predetermined) upper and side regions d3 of the plurality of gate patterns 301a and 301b.

Afterwards, a surface layer 362 may be formed to a sixth thickness t6 on surfaces of the desired (or, alternatively, predetermined) upper and side regions d3 of the plurality of gate patterns 301a and 301b.

The sixth thickness t6 (which corresponds to the second thickness t2 described according to the first example embodiment of the inventive concepts) may be a thickness capable of forming the metal silicides 380a and 380b. Thus, the sixth thickness t6, which may be the same as the second thickness t2, may be 10 Å or less. In a non-limiting embodiment, the sixth thickness t6 may be 30 Å or less in consideration of subsequent processes such as cleaning and etching.

The recess process may use dry cleaning using $NH_3$ and HF or dry etching. The recess process may also include ashing and stripping. For instance, the stripping may include organic stripping and HS stripping.

The liner insulating layer 360 and the gap fill layer may be simultaneously recessed. To this end, the liner insulating layer 360 and the gap fill layer may have different etch rates from each other. In this case, as described in the first example embodiment of the inventive concepts, the liner insulating layer 360 may be formed by thermal oxidation. The gap fill layer may be formed by C-FCVD.

Alternatively, it should be understood that the liner insulating layer 360 and the gap fill layer may be sequentially recessed.

Then, the gap fill layer disposed on the liner insulating layer 360 may be removed. The removal of the gap fill layer may be accomplished by wet cleaning using HF and DSC or wet etching using HS or $O_3HF$.

The gap fill layer may be completely removed. However, in the method of fabricating the semiconductor device according to the third example embodiment of the inventive concepts (as also described in connection with the first example embodiment of the inventive concepts), the gap fill layer may be partially removed.

Subsequently, referring to FIG. 6B, a metal layer (not shown) may be formed on the liner insulating layer 360. The metal layer may be formed of a material selected from the group consisting of cobalt (Co), tungsten (W), titanium (Ti), nickel (Ni), and an alloy thereof. The metal layer may be formed by PVD, CVD, and ALD.

A passivation layer (not shown) may be further formed on the metal layer. The passivation layer may prevent oxidation of the metal layer. The passivation layer may be formed of titanium nitride ($TiN_x$), although example embodiments are not limited thereto. The passivation layer may be formed by CVD or ALD.

Then, metal silicides 380a and 380b may be formed using the metal layer. Here, as described above, the liner insulating layer 360 having the fifth thickness t5 may inhibit formation of the metal silicides 380a and 380b. Thus, the metal silicides 380a and 380b may be formed only in the desired (or, alternatively, predetermined) upper regions d3 of the cell gate pattern 301a and the selection gate pattern 301b covered with the surface layer 362 having the sixth thickness t6.

After the metal silicides 380a and 380b are formed, the remaining metal layer and passivation layer may be removed. Subsequently, spacers 390 may be formed on side surfaces of the cell gate pattern 301a and the selection gate pattern 301b. The spacers 390 may be formed of an MTO layer by thermal oxidation.

Subsequently, a polishing stopper 392 may be formed on the liner insulating layer 360, the surface layer 362, and the spacers 390. The polishing stopper 392 may be formed of a material selected from the group consisting of an oxide layer, a nitride layer, and a stacked combination layer thereof.

Then, an interlayer insulating layer 394 may be formed on the polishing stopper 392, and thus the semiconductor device formed by the method according to the third example embodiment of the inventive concepts may be completed. Here, the interlayer insulating layer 394 may be formed of a material having a different etch rate from the polishing stopper 392.

As a result, in the method of fabricating the semiconductor device according to the third example embodiment of the inventive concepts, a liner insulating layer may be formed to different thicknesses in the region in which the metal silicides are formed on the plurality of gate patterns using the liner insulating layer and the gap fill layer formed by FCVD or SOG and in the other regions. In detail, the liner insulating layer may be formed on the surfaces of the plurality of gate patterns in the region in which the metal silicides will be formed to have a smaller thickness than those in the other regions. Accordingly, the metal silicides may be formed to a relatively uniform thickness in the desired (or, alternatively, predetermined) upper region of the plurality of gate patterns using a difference in thickness of the liner insulating layer.

(Fourth Example Embodiment)

Figure 7:
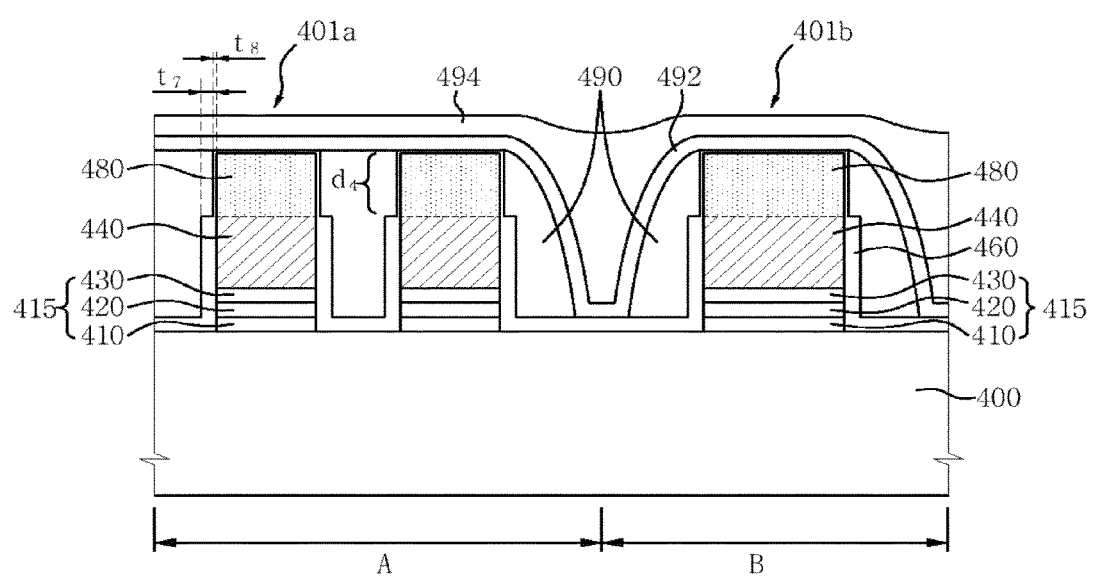
FIG. 7 is a cross-sectional view illustrating a method of fabricating a semiconductor device according to a fourth example embodiment of the inventive concepts.

FIG. 7 is a cross-sectional view illustrating a method of fabricating a semiconductor device according to a fourth example embodiment of the inventive concepts.

The method of fabricating the semiconductor device according to the fourth example embodiment of the inventive concepts will be described with reference to FIG. 7. In the method of fabricating the semiconductor device according to the fourth example embodiment of the inventive concepts, a substrate 400 including a first region A and a second region B may be prepared. Here, the first region A of the substrate 400 may be a region in which a cell gate pattern 401a is formed by a subsequent process. The second region B of the substrate 400 may be a region in which a selection gate pattern 401b is formed by a subsequent process.

Subsequently, a charge tunneling layer 410, a charge trapping layer 420, and a charge blocking layer 430 may be formed on the substrate 400. Here, the charge tunneling layer 410 may be a layer in which a charge is tunneled.

The charge tunneling layer 410 may be formed of a high-k dielectric material such as $Al_2O_3$, $HfO_2$, $La_2O_3$, $Ta_2O3$, $TiO_2$, $SrTiO_3$ (STO), or $(Ba, Sr)TiO_3$ (BST), or a combination layer in which these materials are stacked. The charge tunneling layer 410 may be formed by thermal oxidation, CVD, or ALD.

The charge trapping layer 420 may store the charges by trapping the tunneled charges. The charge trapping layer 420 may be formed of silicon nitride ($Si_xN_y$), although example embodiments are not limited thereto. For instance, the charge trapping layer 420 may also be formed of a metal nitride or metal oxynitride.

The charge blocking layer 430 may insulate the charge trapping layer 420 from a gate electrode 440 formed by a subsequent process. The charge blocking layer 430 may be formed of a high-k dielectric material such as $Al_2O_3$, $HfO_2$, $La_2O_3$, $Ta_2O_3$, $TiO_2$, $SrTiO_3$ (STO), or $(Ba, Sr)TiO_3$ (BST), or a combination layer in which these materials are stacked. Here, the charge blocking layer 430 may be formed of a material having a higher dielectric constant than the charge tunneling layer 410.

Then, the charge tunneling layer 410, the charge trapping layer 420, and the charge blocking layer 430 may be etched to form a plurality of trap structures 415. In the method of fabricating the semiconductor device according to the fourth example embodiment of the inventive concepts, the trap structures 415 may be formed in both the first and second regions A and B of the substrate 400 in the same manner.

Subsequently, a seventh silicon layer (not shown) may be formed on the trap structures 415. The seventh silicon layer may be formed of P-Si doped with N- or P-type impurities.

A hard mask pattern (not shown) may be formed on the seventh silicon layer. The hard mask pattern may be formed of a material selected from the group consisting of an oxide layer, a nitride layer, and a stacked combination layer thereof. The hard mask pattern may be formed by forming an insulating layer (not shown) for a hard mask on the seventh silicon layer, and patterning the insulating layer.

Afterwards, the seventh silicon layer may be etched using the hard mask pattern as a mask to form the gate electrode 440 on the trap structures 415, thereby forming gate patterns 401a and 401b of a charge trap-type non-volatile memory device.

The plurality of gate patterns 401a and 401b may include the call gate pattern 401a disposed in the first region A and the selection gate pattern 401b disposed in the second region B.

In the method of fabricating the semiconductor device according to the fourth example embodiment of the inventive concepts, silicon/oxide/nitride/oxide/silicon (SONOS)-type gate patterns are formed as the charge trap-type gate patterns 401a and 401b. However, in the method of fabricating the semiconductor device according to the fourth example embodiment of the inventive concepts, as the charge trap-type gate patterns 401a and 401b, it should be understood that metal/nitride/oxide/silicon (MNOS)- or metal/oxide/nitride/oxide/silicon (MONOS)-type gate patterns may also be formed.

Subsequently, impurities may be doped between the adjacent cell gate patterns 401a, between the cell gate pattern 401a and the selection gate pattern 401b, and into a peripheral active region (not shown) of the selection gate pattern 401b using the hard mask pattern, thereby forming impurity regions (not shown).

A liner insulating layer 460 may be formed on surfaces of the plurality of gate patterns 401a and 401b to have a seventh thickness t7. The liner insulating layer 460 may be formed of one of a thermal oxide layer such as an HTO layer or an MTO layer, a silicon oxide layer, and a silicon nitride layer. The liner insulating layer 460 may be formed by one of thermal oxidation, CVD, and ALD.

The seventh thickness t7 (which corresponds to the first thickness t1 according to the first example embodiment of the inventive concepts) may be a thickness capable of inhibiting formation of metal silicides 480. Thus, the seventh thickness t7 may exceed 30 Å, which may be the same as the first thickness t1. In a non-limiting embodiment, the seventh thickness t7 may be 50 to 200 Å in consideration of processes such as recession, cleaning, and etching.

Subsequently, a gap fill layer (not shown) may be formed on the liner insulating layer 460 by FCVD or SOG. As described above, the gap fill layer formed by FCVD or SOG may fill a gap between the adjacent gate patterns 401a and 401b.

After the gap fill layer is formed, it may be planarized by CMP.

The liner insulating layer 460 and the gap fill layer may be recessed such that the liner insulating layer 460 has an eighth thickness t8, which is smaller than the seventh thickness t7, in the desired (or, alternatively, predetermined) upper and side regions d4 of the plurality of gate patterns 401a and 401b.

The eighth thickness t8 (which corresponds to the second thickness t2 according to the first example embodiment of the inventive concepts) may be a thickness capable of forming the metal silicides 480. Thus, the eighth thickness t8 may be 10 Å or less like the second thickness t2. In addition, the eighth thickness t8 may be 30 Å or less in consideration of subsequent processes such as cleaning and etching.

The recess process may use dry cleaning using $NH_3$ and HF or dry etching. The recess process may also include ashing and stripping. For instance, the stripping may include organic stripping and HS stripping.

The liner insulating layer 460 and the gap fill layer may be simultaneously recessed. To this end, the liner insulating layer 460 and the gap fill layer may have different etch rates from each other. In this case, as described in the first example embodiment of the inventive concepts, the liner insulating layer 460 may be formed by thermal oxidation. The gap fill layer may be formed by C-FCVD.

Alternatively, it should be understood that the liner insulating layer 460 and the gap fill layer may be sequentially recessed.

Subsequently, the gap fill layer disposed on the liner insulating layer 460 may be removed. The removal of the gap fill layer may be accomplished by wet cleaning using HF and DSC or wet etching using $O_3HF$.

The gap fill layer may be completely removed. Alternatively, as described in the first example embodiment of the inventive concepts, the gap fill layer may be partially removed.

Subsequently, a metal layer (not shown) may be formed on the liner insulating layer 460. The metal layer may be formed of a material selected from the group consisting of cobalt (Co), tungsten (W), titanium (Ti), nickel (Ni), and an alloy thereof. The metal layer may be formed by one of PVD, CVD, and ALD.

A passivation layer (not shown) may be further formed on the metal layer. The passivation layer may prevent oxidation of the metal layer. The passivation layer may be formed of a titanium nitride ($TiN_x$), although example embodiments are not limited thereto. The passivation layer may be formed by CVD or ALD.

Then, the metal silicides 480 may be formed using the metal layer. Here, as described above, the liner insulating layer 460 having the seventh thickness t7 may inhibit the formation of the metal silicides 480. Thus, the metal silicides 480 may be formed only in the desired (or, alternatively, predetermined) upper regions d4 of the cell gate pattern 401a and the selection gate pattern 401b covered with a surface layer 362 having the eighth thickness t8.

After the metal silicides 480 are formed, the remaining metal layer and passivation layer may be removed. Subsequently, spacers 490 may be formed on side surfaces of the cell gate pattern 401a and the selection gate pattern 401b. The spacers 490 may be formed of an MTO layer by thermal oxidation.

A polishing stopper 492 may be formed on the liner insulating layer 460 and the spacers 490. The polishing stopper 492 may be formed of a material selected from the group consisting of an oxide layer, a nitride layer, and a stacked combination layer thereof.

Subsequently, an interlayer insulating layer 494 may be formed on the polishing stopper 492, and thus the semiconductor device formed by the method according to the fourth example embodiment of the inventive concepts may be completed. Here, the interlayer insulating layer 494 may be formed of a material having a different etch rate from the polishing stopper 492.

As a result, in the method of fabricating the semiconductor device according to the fourth example embodiment of the inventive concepts, the liner insulating layer may be formed to have different thicknesses on the surfaces of the gate patterns of the SONOS-type semiconductor device using the liner insulating layer and the gap fill layer formed by FCVD or SOG. In detail, the liner insulating layer may be formed to a smaller thickness in the region in which the metal silicides will be formed on the surfaces of the plurality of gate patterns than in the other regions. Accordingly, in the method of fabricating the semiconductor device according to the fourth example embodiment of the inventive concepts, the metal silicides may be formed in the desired (or, alternatively, predetermined) upper regions of the plurality of gate patterns to have a relatively uniform thickness using the difference in thickness of the liner insulating layer.

(Fifth Example Embodiment)

Figure 8:
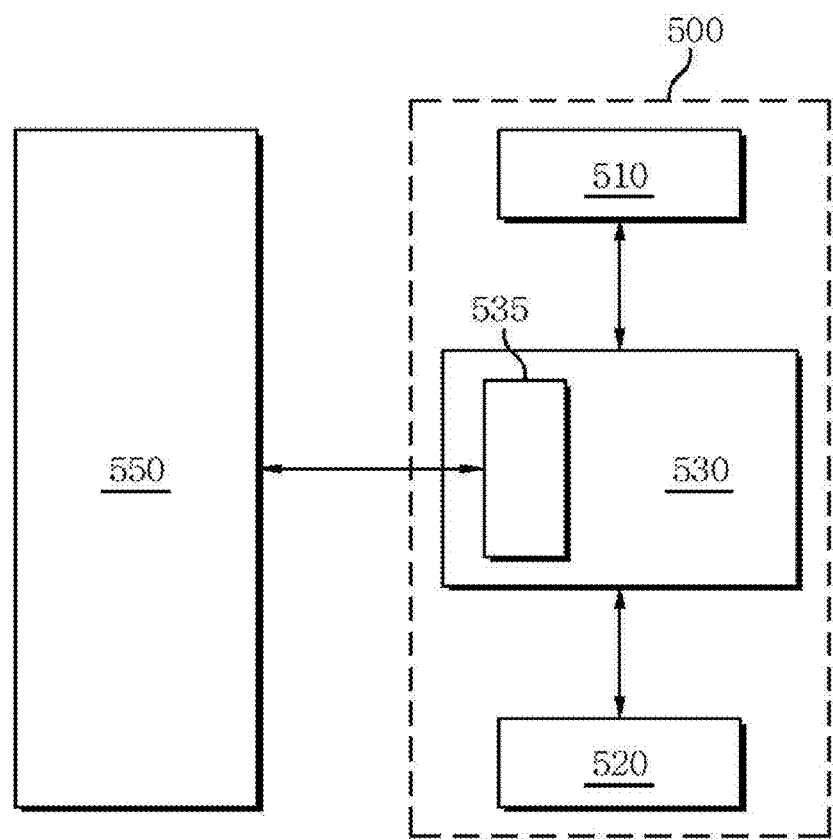
FIGS. 8 and 9 are schematic diagrams of a device and system including the semiconductor device fabricated by one of the methods according the example embodiments of the inventive concepts.

FIG. 8 is a diagram of a device including a semiconductor device fabricated by one of the methods according to the example embodiments of the inventive concepts.

The device may be a data storage device such as a solid state disk (SSD) 500.

The SSD 500 may be a device storing information using the semiconductor device. Compared to a hard disk drive (HDD), the SSD 500 processes data faster, and has less mechanical delay or failure, heat, and noise. In addition, the SSD 500 can be compact and light. The SSD 500 may be applied to laptop computers, desktop computers, MP3 players, or portable storage devices.

Referring to FIG. 8, the SSD 500 may include a non-volatile memory 510, a buffer memory 520, and a controller 530. Here, the non-volatile memory 510 may be fabricated by one of the methods according to the example embodiments of the inventive concepts. The non-volatile memory 510 may be a resistive memory. The non-volatile memory 510 may include a data storage element such as one selected from the group consisting of a phase change material pattern, a magnetic tunnel junction (MTJ) pattern, a polymer pattern, and an oxide pattern.

The buffer memory 520 may include a volatile memory. The volatile memory may be DRAM or SRAM. The buffer memory 520 may exhibit a higher operating speed than the non-volatile memory 510.

The controller 530 may include an interface 535 connected to a host 550. The interface 535 may be in contact with the host 500 to transmit and receive electrical signals such as data. The interface 535 may be a device using one standard selected from the group consisting of SATA, IDE, SCSI, and a composition thereof.

The data processing rate of the interface 535 may be higher than the operating speed of the non-volatile memory 510. Here, the buffer memory 520 may serve to temporarily store data. The data received by the interface 535 may be temporarily stored in the buffer memory 520 via the controller 530, and then permanently stored in the non-volatile memory 510 at a data writing speed of the non-volatile memory 510.

Furthermore, frequently-used data of the data stored in the non-volatile memory 510 may be temporarily stored in the buffer memory 510 through pre-reading. In other words, the buffer memory 510 may serve to increase an efficient operating speed and reduce an error rate of the SSD 500.

The controller 530 may include a memory controller (not shown) and a buffer controller (not shown). The non-volatile memory 510 may be in electrical contact with the adjacent controller 530. The data storage capacity of the SSD 500 may correspond to the non-volatile memory 510. The buffer memory 520 may be in electrical contact with the adjacent controller 530.

The non-volatile memory 510 may be in contact with the interface 535 via the controller 530. The non-volatile memory 510 may serve to store the data received by the interface 535. As a result, even when the power supplied to the SSD 500 is interrupted, the data stored in the non-volatile memory 510 may be conserved.

The data processing speed of the interface 535 may be higher than the operating speed of the non-volatile memory 510. Here, the buffer memory 520 may serve to temporarily store data. The data received by the interface 535 may be temporarily stored in the buffer memory 520 via the controller 530, and then permanently stored in the non-volatile memory 510 at the data writing speed of the non-volatile memory 510. Furthermore, frequently-used data of the data stored in the non-volatile memory 510 may be temporarily stored in the buffer memory 520 by pre-reading. In other words, the buffer memory 520 may serve to increase an efficient operating speed and reduce an error rate of the SSD 500.

(Sixth Example Embodiment)

Figure 9:
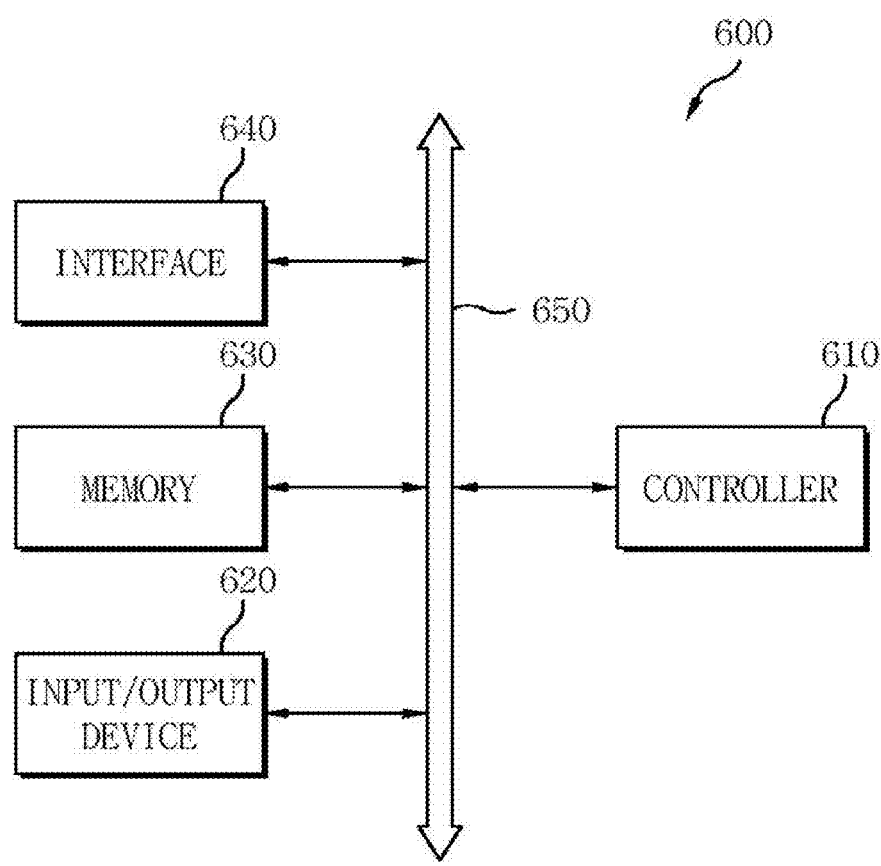

FIG. 9 is a diagram of an electronic system apparatus including a semiconductor device fabricated by one of the methods according to the example embodiments of the inventive concepts.

Referring to FIG. 9, an apparatus 600 including the semiconductor device fabricated by one of the methods according to the example embodiments of the inventive concepts may include a controller 610, an input/output device 620, a memory 630, and an interface 640.

Each of the components of the apparatus 600 may be in contact with each other by a bus 650. The input/output device 620 may be a device such as a keyboard or display. The controller 610 may include at least one microprocessor, a digital processor, a microcontroller or a processor.

The memory 630 may store data and/or a command run by the controller 610. The interface 640 may be used to transmit or receive data to or from another system such as a communication network.

The apparatus 600 may be a mobile system such as a PDA, a portable computer, a web tablet, a wireless phone, a mobile phone, a digital music player, a memory card, or other system capable of transmitting and/or receiving information.

In a method of fabricating a semiconductor device according to the inventive concepts, a liner insulating layer may be formed to have a first thickness on a surface of a gate pattern. The liner insulating layer may be then recessed to have a second thickness, which is smaller than the first thickness, in a desired (or, alternatively, predetermined) region of the gate pattern. Afterwards, a metal silicide may be formed to have a relatively uniform thickness on the plurality of gate patterns using the difference in thickness of the liner insulating layer. In other words, the liner insulating layer may be formed on the surface of the gate pattern to have the desired (or, alternatively, predetermined) difference in thickness, and the metal silicide may be formed to have a relatively uniform thickness.

The foregoing is merely illustrative of various embodiments and is not to be construed as limiting thereof. Although a few embodiments have been described, those skilled in the art will readily appreciate that many modifications are possible without materially departing from the novel teachings and advantages disclosed herein. Accordingly, all such modifications are intended to be included within the scope of the inventive concepts as defined in the claims. In the claims, any means-plus-function clauses are intended to cover the structures described herein as performing the recited function, and not only structural equivalents but also equivalent structures. Therefore, it is to be understood that the foregoing is merely illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
    forming a plurality of gate patterns on a substrate;
    forming a liner insulating layer of a first thickness on the plurality of gate patterns;
    forming a gap fill layer on the liner insulating layer using flowable chemical vapor deposition (FCVD) or spin-on-glass (SOG) so as to fill a gap between adjacent gate patterns of the plurality of gate patterns;
    recessing the gap fill layer and the liner insulating layer such that the first thickness of the liner insulating layer on upper regions of the plurality of gate patterns is reduced to a second thickness;
    forming a metal layer on the liner insulating layer; and
    transforming the upper regions of the plurality of gate patterns into a metal silicide using the metal layer.

2. The method of claim 1, further comprising:
    forming an interlayer insulating layer on the liner insulating layer and the gap fill layer.

3. The method of claim 1, further comprising:
    removing the metal layer remaining on the liner insulating layer after the metal silicide is formed;
    forming a spacer on a side surface of the metal silicide; and
    forming an interlayer insulating layer on the liner insulating layer, the gap fill layer, and the spacer.

4. The method of claim 1, wherein forming the plurality of gate patterns includes:
    forming a first insulating layer on the substrate;
    forming a first silicon layer on the first insulating layer;
    forming a second insulating layer on the first silicon layer;
    forming a second silicon layer on the second insulating layer; and
    etching the first insulating layer, the first silicon layer, the second insulating layer, and the second silicon layer to form the plurality of gate patterns.

5. The method of claim 4, wherein the first and second silicon layers are formed of polycrystalline silicon doped with impurities.

6. The method of claim 4, wherein the second insulating layer is formed of an oxide/nitride/oxide (ONO) layer.

7. The method of claim 1, wherein the gap fill layer is formed of a carbon-containing oxide layer.

8. The method of claim 1, wherein the gap fill layer and the liner insulating layer are simultaneously recessed such that the liner insulating layer has the second thickness on the upper regions of the plurality of gate patterns.

9. A method of fabricating a semiconductor device, comprising:
    forming at least one cell gate pattern and a selection gate pattern on a substrate;
    forming a liner insulating layer of a first thickness on the cell gate pattern and the selection gate pattern;
    forming a gap fill layer on the liner insulating layer using flowable chemical vapor deposition (FCVD) or spin-on-glass (SOG) so as to fill gaps between adjacent cell gate patterns and between the cell gate pattern and the selection gate pattern;
    recessing the gap fill layer and the liner insulating layer such that the first thickness of the liner insulating layer on upper regions of the cell gate pattern and the selection gate pattern is reduced to a second thickness;
    partially or completely removing the gap fill layer;
    forming a metal layer on the liner insulating layer; and
    transforming the upper regions of the cell gate pattern and the selection gate pattern into a metal silicide using the metal layer.

10. The method of claim 9, further comprising:
    forming spacers on side surfaces of the cell gate pattern and the selection gate pattern after the metal silicide is formed.

11. The method of claim 10, further comprising:
    forming an interlayer insulating layer on the liner insulating layer and the spacers.

12. The method of claim 9, wherein the liner insulating layer is formed by one of thermal oxidation, chemical vapor deposition (CVD), and atomic layer deposition (ALD).

13. The method of claim 9, further comprising:
forming a passivation layer on the metal layer before the metal silicide is formed.

14. The method of claim 9, further comprising:
performing chemical mechanical polishing after the gap fill layer is formed.

15. The method of claim 9, wherein the liner insulating layer is formed of a silicon oxide layer or a silicon nitride layer.

16. The method of claim 9, wherein the metal layer is formed of a material selected from the group consisting of cobalt, tungsten, titanium, nickel, and an alloy thereof.

17. A method of fabricating a semiconductor device, comprising:
forming at least one gate pattern;
forming a liner insulating layer on the at least one gate pattern, the liner insulating layer having a first portion that covers a first region of the at least one gate pattern and a second portion that covers a second region of the at least one gate pattern, the first portion and second portion of the liner insulating layer having an initial first thickness;
recessing the second portion of the liner insulating layer such that the initial first thickness of the second portion is reduced to a second thickness while maintaining the initial first thickness of the first portion of the liner insulating layer;
forming a metal layer on the liner insulating layer; and
transforming the second region of the at least one gate pattern into a metal silicide.

18. The method of claim 17, wherein the forming at least one gate pattern includes forming a cell gate pattern and a selection gate pattern.

19. The method of claim 18, wherein the at least one selection gate pattern includes a string selection gate pattern and a ground selection gate pattern.

20. The method of claim 17, wherein the recessing the second portion of the liner insulating layer includes recessing a continuous section of the liner insulating layer that covers an uppermost surface and uppermost sidewalls of the at least one gate pattern.

* * * * *